US012634645B2

(12) United States Patent
Zhou et al.

(10) Patent No.: US 12,634,645 B2
(45) Date of Patent: May 19, 2026

(54) BONE CONDUCTION SOUND TRANSMISSION DEVICES

(71) Applicant: SHENZHEN SHOKZ CO., LTD., Shenzhen (CN)

(72) Inventors: Wenbing Zhou, Shenzhen (CN); Yongshuai Yuan, Shenzhen (CN); Wenjun Deng, Shenzhen (CN); Xin Qi, Shenzhen (CN); Fengyun Liao, Shenzhen (CN)

(73) Assignee: SHENZHEN SHOKZ CO., LTD., Shenzhen (CN)

( * ) Notice: Subject to any disclaimer, the term of this patent is extended or adjusted under 35 U.S.C. 154(b) by 604 days.

(21) Appl. No.: 18/166,497

(22) Filed: Feb. 9, 2023

(65) Prior Publication Data

US 2023/0188911 A1     Jun. 15, 2023

Related U.S. Application Data

(63) Continuation of application No. PCT/CN2020/142533, filed on Dec. 31, 2020.

(51) Int. Cl.
*H04R 25/00* (2006.01)
*H04R 1/46* (2006.01)
(Continued)

(52) U.S. Cl.
CPC ............. *H04R 25/606* (2013.01); *H04R 1/46* (2013.01); *H04R 17/025* (2013.01); *H04R 17/10* (2013.01);
(Continued)

(58) Field of Classification Search
CPC ...... H04R 25/606; H04R 1/46; H04R 17/025; H04R 17/10; H04R 2460/13; H10N 30/501; H10N 30/50; H10N 30/308
(Continued)

(56) References Cited

U.S. PATENT DOCUMENTS 4,150,262 A     4/1979 Ono
6,724,127 B2     4/2004 Takeuchi et al.
(Continued)

FOREIGN PATENT DOCUMENTS

CN     1956604 A     5/2007
CN     101634662 A     1/2010
(Continued)

OTHER PUBLICATIONS

Notice of Reasons for Rejection in Japanese Application No. 2023518844 mailed on May 27, 2024, 11 pages.
(Continued)

*Primary Examiner* — Sean H Nguyen
(74) *Attorney, Agent, or Firm* — METIS IP LLC

(57) ABSTRACT

The present disclosure is of a bone conduction sound transmission device. The bone conduction sound transmission device comprises a laminated structure and a base structure. The laminated structure is formed by a vibration unit and an acoustic transducer unit. A base structure is configured to load the laminated structure, and at least one side of the laminated structure is physically connected to the base structure. The base structure vibrates based on an external vibration signal, and the vibration unit deforms in response to the vibration of the base structure; and the acoustic transducer unit generates an electrical signal based on the deformation of the vibration unit.

12 Claims, 21 Drawing Sheets

100

(51) Int. Cl.

| | | |
|---|---|---|
| *H04R 17/02* | (2006.01) | |
| *H04R 17/10* | (2006.01) | |
| *H10N 30/30* | (2023.01) | |
| *H10N 30/50* | (2023.01) | |

(52) U.S. Cl.
   CPC ........... *H10N 30/308* (2023.02); *H10N 30/50* (2023.02); *H10N 30/501* (2023.02); *H04R 2460/13* (2013.01)

(58) Field of Classification Search
   USPC ........................................................ 381/151
   See application file for complete search history.

(56) References Cited

U.S. PATENT DOCUMENTS

| | | | |
|---|---|---|---|
| 10,078,097 | B2 | 9/2018 | Dubbeldeman et al. |
| 2001/0004180 | A1 | 6/2001 | Kishimoto |
| 2007/0041595 | A1 | 2/2007 | Carazo et al. |
| 2009/0190782 | A1 | 7/2009 | Suzuki et al. |
| 2012/0266686 | A1 | 10/2012 | Huffman |
| 2013/0233078 | A1 | 9/2013 | Sinclair |
| 2013/0301856 | A1 | 11/2013 | Kim et al. |
| 2017/0288122 | A1 | 10/2017 | Zou et al. |
| 2018/0254403 | A1 | 9/2018 | Jeong et al. |
| 2019/0089325 | A1 | 3/2019 | Yanagitani et al. |
| 2020/0196065 | A1 | 6/2020 | Pedersen et al. |

FOREIGN PATENT DOCUMENTS

| | | | |
|---|---|---|---|
| CN | 103024647 | A | 4/2013 |
| CN | 203181217 | U | 9/2013 |
| CN | 105080822 | A | 11/2015 |
| CN | 105262371 | A | 1/2016 |
| CN | 109916502 | A | 6/2019 |
| CN | 208987176 | U | 6/2019 |
| CN | 110567573 | A | 12/2019 |
| CN | 110987159 | A | 4/2020 |
| CN | 111013993 | A | 4/2020 |
| CN | 111556419 | A | 8/2020 |
| CN | 211378247 | U | 8/2020 |
| DE | 102015106240 | A1 | 10/2016 |
| JP | H08195995 | A | 7/1996 |
| JP | H08205273 | A | 8/1996 |
| JP | H09163477 | A | 6/1997 |
| JP | 2003274470 | A | 9/2003 |
| JP | 2003345381 | A | 12/2003 |
| JP | 2004020952 | A | 1/2004 |
| JP | 2006100954 | A | 4/2006 |
| JP | 2014013735 | A | 1/2014 |
| JP | 5876626 | B1 | 1/2016 |
| KR | 20060037158 | A | 5/2006 |
| WO | 2013032821 | A1 | 3/2013 |

OTHER PUBLICATIONS

The Second Office Action in Chinese Application No. 202011639837.2 mailed on Apr. 30, 2025, 17 pages.

The Extended European Search Report in European Application No. 20967923.2 mailed on Jan. 18, 2024, 8 pages.

First Office Action in Russian Application No. 2023103921 mailed on Jul. 3, 2023, 20 pages.

First Office Action in Chinese Application No. 202011639837.2 mailed on Oct. 29, 2024, 13 pages.

International Search Report in PCT/CN2020/142533 mailed on Sep. 6, 2021, 6 pages.

Written Opinion in PCT/CN2020/142533 mailed on Sep. 6, 2021, 6 pages.

100

300

400

500

700

800

1000

1500

1510

1530

1540

1600

1900

1930

1920

1910

2000

2030
2040
2020

2010

2100

2130
2120

2110

BONE CONDUCTION SOUND TRANSMISSION DEVICES

CROSS-REFERENCE TO RELATED APPLICATIONS

This application is a continuation of International Application No. PCT/CN2020/142533, filed on Dec. 31, 2020, the entire contents of which are hereby incorporated by reference.

TECHNICAL FIELD

The present disclosure relates to the technical field of a sound transmission device, and in particular, to a bone conduction sound transmission device.

BACKGROUND

The microphone receives an external vibration signal, uses the acoustic transducer unit to convert the vibration signal into an electrical signal, and outputs the electrical signal after processing by the back-end circuit. The air conduction microphone receives the air conduction sound signal, and the sound signal is transmitted through the air, i.e., the air conduction microphone receives the air vibration signal. The bone conduction microphone receives the bone conduction sound signal, and the sound signal is transmitted through human bones, i.e., the bone conduction microphone receives the bone vibration signal. Compared with the air conduction microphone, the bone conduction microphone has advantages in noise immunity. In a noisy environment, the bone conduction microphone is less disturbed by environmental noise, which can collect human voices well.

Existing bone conduction microphones are too complex, which requires a high-level preparation process. Insufficient connection strength among some of their components causes the problem of insufficient reliability, which affects the output signal. Therefore, it is desirable to provide a bone conduction sound transmission device with simple structure and greater stability.

SUMMARY

One aspect of the present disclosure provides a bone conduction sound transmission device. The bone conduction sound transmission device may comprise a laminated structure and a base structure. The laminated structure may be formed by a vibration unit and an acoustic transducer unit. The base structure may be configured to load the laminated structure, and at least one side of the laminated structure may be physically connected to the base structure. The base structure may vibrate based on an external vibration signal, and the vibration unit may deform in response to the vibration of the base structure. The acoustic transducer unit may generate an electrical signal based on the deformation of the vibration unit.

In some embodiments, the base structure may include a hollow frame structure. One end of the laminated structure may be connected to the base structure, and other end of the laminated structure may be suspended in a hollow part of the frame structure.

In some embodiments, the vibration unit may include at least one elastic layer. The acoustic transducer unit may include at least a first electrode layer, a piezoelectric layer, and a second electrode layer arranged in sequence from top to bottom. The at least one elastic layer may be located on an upper surface of the first electrode layer or a lower surface of the second electrode layer.

In some embodiments, the acoustic transducer unit may further include a seed layer, and the seed layer may be located on the lower surface of the second electrode layer.

In some embodiments, a cover area of the first electrode layer, the piezoelectric layer, or the second electrode layer may be less than or equal to an area of the laminated structure, and the first electrode layer, the piezoelectric layer, or the second electrode layer may be close to a connection between the laminated structure and the base structure.

In some embodiments, the vibration unit may include at least one elastic layer, and the acoustic transducer unit may include at least an electrode layer and a piezoelectric layer. The at least one elastic layer may be located on a surface of the electrode layer.

In some embodiments, the electrode layer may include a first electrode and a second electrode. The first electrode may be bent into a first comb-shaped structure, and the second electrode may be bent into a second comb-shaped structure. The first comb-shaped structure and the second comb-shaped structure may be matched to form the electrode layer. The electrode layer may be located on an upper surface or a lower surface of the piezoelectric layer.

In some embodiments, the first comb-shaped structure and the second comb-shaped structure may extend along a length direction of the laminated structure.

In some embodiments, the vibration unit may include a suspension membrane structure. The acoustic transducer unit may include a first electrode layer, a piezoelectric layer, and a second electrode layer arranged in sequence from top to bottom. The suspension membrane structure may be connected to the base structure through a peripheral side of the suspension membrane structure, and the acoustic transducer unit may be located on an upper surface or a lower surface of the suspension membrane structure.

In some embodiments, the suspension membrane structure may include a plurality of holes, and the plurality of holes may be distributed along a circumferential direction of the acoustic transducer unit.

In some embodiments, radial distances from an edge of the acoustic transducer unit to centers of the plurality of holes may be within a range of 100 μm-400 μm.

In some embodiments, the acoustic transducer unit may be a ring structure, and a thickness of the suspension membrane structure located in an inner region of the ring structure may be greater than a thickness of the suspension membrane structure located in an outer region of the ring structure.

In some embodiments, the acoustic transducer unit may be a ring structure, and a density of the suspension membrane structure located in an inner region of the ring structure may be greater than a density of the suspension membrane structure located in an outer region of the ring structure.

In some embodiments, the vibration unit may further include a mass element, and the mass element may be located on an upper surface or a lower surface of the suspension membrane structure.

In some embodiments, the acoustic transducer unit and the mass element may be respectively located on different sides of the suspension membrane structure.

In some embodiments, the acoustic transducer unit and the mass element may be located on a same side of the suspension membrane structure. The acoustic transducer unit may be a ring structure, and the ring structure may be distributed along a circumferential direction of the mass element.

In some embodiments, the vibration unit may include at least one support arm and a mass element, and the mass element may be connected to the base structure through the at least one support arm.

In some embodiments, the at least one support arm may include at least one elastic layer, and the acoustic transducer unit may be located on an upper surface, a lower surface, or interior of the at least one support arm.

In some embodiments, the acoustic transducer unit may include a first electrode layer, a piezoelectric layer, and a second electrode layer arranged in sequence from top to bottom. The first electrode layer or the second electrode layer may be connected to the upper surface or the lower surface of the at least one support arm.

In some embodiments, the mass element may be located on an upper surface or a lower surface of the first electrode layer or an upper surface or a lower surface of the second electrode layer.

In some embodiments, an area of the first electrode layer, the piezoelectric layer, or the second electrode layer may be less than or equal to an area of the at least one support arm, and a part or all of the first electrode layer, the piezoelectric layer, or the second electrode layer may cover the upper surface or the lower surface of the at least one support arm.

In some embodiments, an area of the first electrode layer may be less than or equal to an area of the piezoelectric layer, and an entire region of the first electrode layer may be located on a surface of the piezoelectric layer.

In some embodiments, the first electrode layer, the piezoelectric layer, and the second electrode layer of the acoustic transducer unit may be close to the mass element or a connection between the support arm and the base structure.

In some embodiments, the at least one support arm may include at least one elastic layer, and the at least one elastic layer may be located on the upper surface or the lower surface of the first electrode layer or the upper surface or the lower surface of the second electrode layer.

In some embodiments, the bone conduction sound transmission device may further comprise a limiting structure located in a hollow part of the base structure. The limiting structure may be connected to the base structure, and the limiting structure may be located above or below the mass element.

In some embodiments, any of the foregoing bone conduction sound transmission device may further comprise at least one damping layer. The at least one damping layer may cover the upper surface, the lower surface, or the interior of the laminated structure.

BRIEF DESCRIPTION OF THE DRAWINGS

The present disclosure is further illustrated in terms of exemplary embodiments. These exemplary embodiments are described in detail with reference to the drawings. These embodiments are not limiting, and in these embodiments, the same number indicates the same structure, wherein.

DETAILED DESCRIPTION

Figure 1:
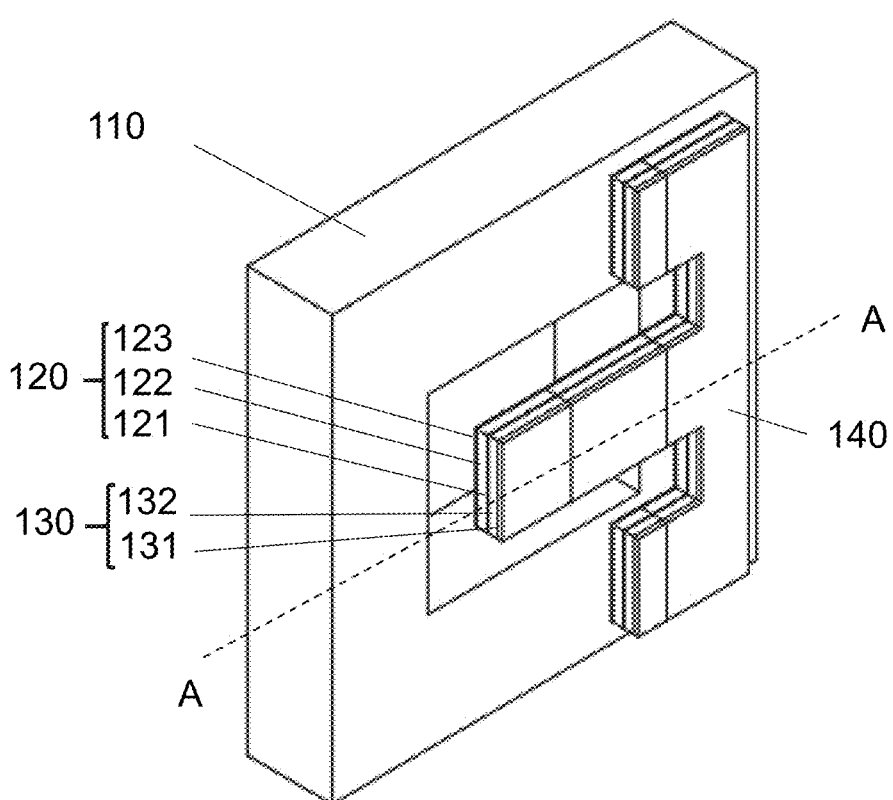
FIG. 1 is a schematic structural diagram illustrating a bone conduction sound transmission device according to some embodiments of the present disclosure.

In order to more clearly illustrate the technical solutions of the embodiments of the present disclosure, the following briefly introduces the drawings that need to be used in the description of the embodiments. Obviously, the drawings described below are only some examples or embodiments of the present disclosure. Those having ordinary skills in the art, without further creative efforts, may apply the present disclosure to other similar scenarios according to these drawings. Unless obviously obtained from the context or the context illustrates otherwise, the same numeral in the drawings refers to the same structure or operation. It should be understood that the drawings are for purposes of illustration and description only, and are not intended to limit the scope of the disclosure. It should be understood that the drawings are not drawn to scale.

It should be understood that, for the convenience of describing the present disclosure, the terms "center", "upper surface", "lower surface", "upper", "lower", "top", "bottom", "inner", "outer", "axial", "radial", "peripheral", "external" and other indicated positional relationships are based on the positional relationship shown in the drawings, and do not indicate that the referred devices, components or units must have a specific positional relationship, which can not be construed as a limitation of this disclosure.

It should be understood that "system", "device", "unit" and/or "module" as used herein is a method for distinguishing different components, elements, parts, portions, or assemblies of different levels. However, the words may be replaced by other expressions if other words can achieve the same purpose.

As used in the disclosure and the appended claims, the singular forms "a," "an," and "the" do not specifically refer to the singular, but may also include the plural, unless the content clearly dictates otherwise. In In general, the terms "comprise," "comprises," and/or "comprising," "include," "includes," and/or "including," merely prompt to include steps and elements that have been clearly identified, and these steps and elements do not constitute an exclusive listing. The methods or devices may also include other steps or elements.

The flowchart is used in this disclosure to illustrate the operations performed by the system according to the embodiments of this disclosure. It should be understood that the preceding or following operations are not necessarily performed in the exact order. Instead, various steps may be processed in reverse order or simultaneously. Meanwhile, other operations may be added to these procedures, or a certain step or steps may be removed from these procedures.

The bone conduction sound transmission device provided by some embodiments of the present disclosure may include a base structure and a laminated structure. In some embodiments, the base structure may be a regular or irregular three-dimensional structure with a hollow part inside the base structure. For example, the base structure may be a hollow frame structure, including but not limited to regular shapes such as a rectangular frame, a circular frame, a regular polygonal frame, and any irregular shapes. The laminated structure may be located in the hollow part of the base structure or at least partially suspended above the hollow part of the base structure. In some embodiments, at least part of the laminated structure may be physically connected to the base structure. The "connection" here may be understood that after the laminated structure and the base structure are respectively prepared, the laminated structure and the base structure may be fixedly connected by means of welding, riveting, clamping, bolts, etc., or the laminated structure may be deposited on the base structure by physical deposition (e.g., physical vapor deposition) or chemical deposition (e.g., chemical vapor deposition) during the preparation process. In some embodiments, at least part of the laminated structure may be fixed on an upper surface or a lower surface of the base structure, and at least part of the laminated structure may also be fixed on a side wall of the base structure. For example, the laminated structure may be a cantilever beam. The cantilever beam may be a plate-shaped structure. One end of the cantilever beam may be connected to the upper surface or the lower surface of the base structure, or the side wall where the hollow part of the base structure is located, and the other end of the cantilever beam may not be connected or contacted with the base structure, so that the other end of the cantilever beam is suspended in the hollow part of the base structure. As another example, the laminated structure may include a diaphragm layer (also referred to as a suspension membrane structure). The suspension membrane structure may be fixedly connected to the base structure. The laminated structure may be arranged on the upper surface or the lower surface of the suspension membrane structure. As another example, the laminated structure may include a mass element and one or more support arms. The mass element may be fixedly connected to the base structure through the one or more support arms. One end of the support arm may be connected to the base structure, and the other end of the support arm may be connected to the mass element, so that the mass element and part of the support arm may be suspended in the hollow part of the base structure. It should be known that "located in the hollow part of the base structure" or "suspended in the hollow part of the base structure" mentioned in this disclosure may mean "suspended in, below, or above the hollow part of the base structure". In some embodiments, the laminated structure may include a vibration unit and an acoustic transducer unit. Specifically, the base structure may vibrate based on an external vibration signal, and the vibration unit may deform in response to the vibration of the base structure; and the acoustic transducer unit may generate an electrical signal based on the deformation of the vibration unit. It should be known that the description of the vibration unit and the acoustic transducer unit here is only for the purpose of conveniently introducing the working principle of the laminated structure, and does not limit the actual composition and structure of the laminated structure. In fact, the vibration unit may not be necessary, and its function may be completely implemented by the acoustic transducer unit. For example, after certain changes are made to the structure of the acoustic transducer unit, the acoustic transducer unit may directly respond to the vibration of the base structure to generate the electrical signal.

The vibration unit may refer to a part of the laminated structure that easily deforms by an external force. The vibration unit may be used to transmit the deformation caused by the external force to the acoustic transducer unit. In some embodiments, the vibration unit and the acoustic transducer unit may overlap to form the laminated structure. The acoustic transducer unit may be located on the upper layer of the vibration unit. The acoustic transducer unit may also be located on the lower layer of the vibration unit. For example, when the laminated structure is a cantilever beam, the vibration unit may include at least one elastic layer, and the acoustic transducer unit may include a first electrode layer, a piezoelectric layer, and a second electrode layer arranged in sequence from top to bottom. The elastic layer may be located on a surface of the first electrode layer or a surface of the second electrode layer. The elastic layer may deform during a vibration process. The piezoelectric layer may generate an electrical signal based on the deformation of the elastic layer. The first electrode layer and the second electrode layer may collect the electrical signal. As another example, the vibration unit may also be a suspension membrane structure. By changing a density of a specific region of the suspension membrane structure, punching holes in the suspension membrane structure, or setting a counterweight (also referred to as a mass element) on the suspension membrane structure, the suspension membrane structure near the acoustic transducer unit may be more likely to deform under the action of an external force, thereby driving the acoustic transducer unit to generate the electrical signal. As another example, the vibration unit may include at least one support arm and a mass element. The mass element may be suspended in the hollow part of the base structure through the at least one support arm. When the base structure vibrates, the support arm and the mass element of the vibration unit may move relative to the base structure. The support arm may deform to act on the acoustic transducer unit to generate the electrical signal.

The acoustic transducer unit may refer to a part of the laminated structure that converts the deformation of the vibration unit into the electrical signal. In some embodiments, the acoustic transducer unit may include at least two electrode layers (e.g., the first electrode layer and the second electrode layer), and the piezoelectric layer. The piezoelectric layer may be located between the first electrode layer and the second electrode layer. The piezoelectric layer may refer to a structure that generates voltage on two ends of the piezoelectric layer under action of an external force. In some embodiments, the piezoelectric layer may be a piezoelectric polymer membrane obtained by a semiconductor deposition process (e.g., magnetron sputtering, Metal-organic Chemical Vapor Deposition (MOCVD)). In the embodiments of the present disclosure, the piezoelectric layer may generate the voltage under a deformation stress of the vibration unit. The first electrode layer and the second electrode layer may collect the voltage (electrical signal). In some embodiments, materials of the piezoelectric layer may include piezoelectric crystal material and piezoelectric ceramic material. The piezoelectric crystal may refer to a piezoelectric monocrystal. In some embodiments, the piezoelectric crystal material may include crystal, sphalerite, boborite, tourmaline, zincite, GaAs, barium titanate and its derivative structure crystals, $KH_2PO_4$, $NaKC_4H_4O_6 \cdot 4H_2O$ (Rochelle salt), etc., or any combination thereof. The piezoelectric ceramic material may refer to a piezoelectric polycrystal prepared by random collection of fine grains obtained by solid-state reaction and sintering between different material powders. In some embodiments, the piezoelectric ceramic material may include barium titanate (BT), lead zirconate titanate (PZT), lead barium lithium niobate (PBLN), modified lead titanate (PT), aluminum nitride (AlN), zinc oxide (ZnO), or any combination thereof. In some embodiments, the piezoelectric layer material may also be a piezoelectric polymer material, such as polyvinylidene fluoride (PVDF), etc.

In some embodiments, the base structure and the laminated structure may be located in a housing of the bone conduction sound transmission device. The base structure may be fixedly connected to an inner wall of the housing. The laminated structure may be loaded on the base structure. When the housing of the bone conduction sound transmission device vibrates due to an external force (e.g., when a human speaks, the vibration of the face causes the housing to vibrate), and the housing vibrates to drive the base structure to vibrate. Because the laminated structure and the housing structure (or base structure) have different properties, the movement between the laminated structure and the housing may not be completely consistent, resulting in a relative motion, which in turn causes deformation of the vibration unit of the laminated structure. Further, when the vibration unit deforms, the piezoelectric layer of the acoustic transducer unit may be subjected to a deformation stress of the vibration unit to generate a potential difference (voltage). At least two electrode layers (e.g., the first electrode layer and the second electrode layer) respectively located on the upper surface and the lower surface of the piezoelectric layer in the acoustic transducer unit may collect the potential difference to convert the external vibration signal into the electrical signal. As an illustration only, the bone conduction sound transmission device described in the embodiments of the present disclosure may be applied to an earphone (e.g., a bone conduction earphone or an air conduction earphone), glasses, virtual reality equipment, a helmet, etc. The bone conduction sound transmission device may be placed on the human head (e.g., the face), the neck, near the ears, and the top of the head. The bone conduction sound transmission device may collect a vibration signal of the bone when the person speaks, and convert the vibration signal into the electrical signal to implement sound collection. It should be noted that the base structure may not be limited to a structure independent of the housing of the bone conduction sound transmission device. In some embodiments, the base structure may also be a part of the housing of the bone conduction sound transmission device.

Figure 2:
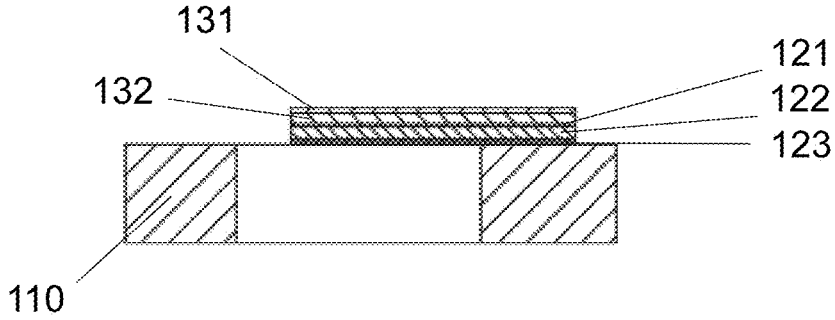
FIG. 2 is a sectional view of the bone conduction sound transmission device in FIG. 1 along an A-A axis according to some embodiments of the present disclosure.

FIG. 1 is a schematic structural diagram illustrating a bone conduction sound transmission device according to some embodiments of the present disclosure. FIG. 2 is a sectional view of the bone conduction sound transmission device in FIG. 1 along an A-A axis according to some embodiments of the present disclosure.

As shown in FIGS. 1 and 2, the bone conduction sound transmission device 100 may include a base structure 110 and a laminated structure, and at least part of the laminated structure may be connected to the base structure 110. The base structure 110 may be a hollow frame structure, and part of the laminated structure (e.g., an end of the laminated structure away from a connection between the base structure 110 and the laminated structure) may be located in a hollow part of the hollow frame structure. It should be noted that the frame structure is not limited to the cuboid shown in FIG. 1. In some embodiments, the frame structure may be a regular or irregular structure such as a prism, a cylinder, etc. In some embodiments, the laminated structure may be fixedly connected to the base structure 110 in the form of a cantilever beam. Further, the laminated structure may include a fixed end and a free end. The fixed end of the laminated structure may be fixedly connected to the frame structure, and the free end of the laminated structure may not be connected or contacted with the frame structure, so that the free end of the laminated structure may be suspended in the hollow part of the frame structure. In some embodiments, the fixed end of the laminated structure may be connected to an upper surface or a lower surface of the base structure 110, or a side wall where the hollow part of the base structure 110 is located. In some embodiments, the side wall where the hollow part of the base structure 110 is located may also be provided with a mounting groove adapted to the fixed end of the laminated structure, so that the fixed end of the laminated structure and the base structure 110 may be connected in a cooperated manner. In some embodiments, in order to improve the stability between the laminated structure and the base structure 110, the laminated structure may include a connecting base 140. As an example only, as shown in FIG. 1, the connecting base 140 may be fixedly connected to the fixed end of the laminated structure. In some embodiments, a fixed end of the connecting base 140 may be located on the upper surface or the lower surface of the base structure 110. In some embodiments, the fixed end of the connecting base 140 may also be located at the side wall where the hollow part of the base structure 110 is located. For example, the side wall where the hollow part of the base structure 110 is located may be provided with a mounting groove adapted to the fixed end, so that the fixed end of the laminated structure and the base structure 110 may be connected in a cooperated manner through the mounting groove. The "connection" here may be understood as fixedly connecting the laminated structure and the base structure 110 by means of welding, riveting, bonding, bolting, clamping, etc. after preparing the laminated structure and the base structure 110 respectively, or depositing the laminated structure on the base structure 110 through physical deposition (e.g., physical vapor deposition) or chemical deposition (e.g., chemical vapor deposition) during the preparation process. In some embodiments, the connecting base 140 may be a structure independent of the laminated structure or integrally formed with the laminated structure.

In some embodiments, the laminated structure may include an acoustic transducer unit 120 and a vibration unit 130. The vibration unit 130 may refer to a part of the laminated structure that may produce elastic deformation. The acoustic transducer unit 120 may refer to a part of the laminated structure that converts the deformation of the vibration unit 120 into an electrical signal. In some embodiments, the vibration unit 130 may be located on the upper surface or the lower surface of the acoustic transducer unit 120. In some embodiments, the vibration unit 130 may include at least one elastic layer. For illustrative purposes only, the vibration unit 130 as shown in FIG. 1 may include a first elastic layer 131 and a second elastic layer 132 arranged in sequence from top to bottom. The first elastic layer 131 and the second elastic layer 132 may be plate-shaped structures made of semiconductor materials. In some embodiments, the semiconductor materials may include silicon dioxide, silicon nitride, gallium nitride, zinc oxide, silicon carbide, etc. In some embodiments, the materials of the first elastic layer 131 and the second elastic layer 132 may be the same or different. In some embodiments, the acoustic transducer unit 120 may include at least a first electrode layer 121, a piezoelectric layer 122, and a second electrode layer 123 arranged in sequence from top to bottom. The elastic layers (e.g., the first elastic layer 131 and the second elastic layer 132) may be located on the upper surface of the first electrode layer 121 or the lower surface of the second electrode layer 123. The piezoelectric layer 122 may generate a voltage (potential difference) under a deformation stress of the vibration unit 130 (e.g., the first elastic layer 131 and the second elastic layer 132) based on a piezoelectric effect. The first electrode layer 121 and the second electrode layer 123 may export the voltage (electrical signal). In some embodiments, the material of the piezoelectric layer may include piezoelectric crystal material and piezoelectric ceramic material. The piezoelectric crystal material may refer to a piezoelectric monocrystal. In some embodiments, the piezoelectric crystal material may include crystal, sphalerite, boborite, tourmaline, zincite, GaAs, barium titanate and its derivative structure crystals, $KH_2PO_4$, $NaKC_4H_4O_6 \cdot 4H_2O$ (Rochelle salt), etc., or any combination thereof. The piezoelectric ceramic material may refer to a piezoelectric polycrystal prepared by random collection of fine grains obtained by solid-state reaction and sintering between different material powders. In some embodiments, the piezoelectric ceramic material may include barium titanate (BT), lead zirconate titanate (PZT), lead barium lithium niobate (PBLN), modified lead titanate (PT), aluminum nitride (AlN), zinc oxide (ZnO), etc., or any combination thereof. In some embodiments, the piezoelectric layer material may also be a piezoelectric polymer material, such as polyvinylidene fluoride (PVDF), etc. In some embodiments, the first electrode layer 121 and the second electrode layer 123 may have a conductive material structure. Exemplarily, a conductive material may include a metal, an alloy material, a metal oxide material, graphene, etc., or any combination thereof. In some embodiments, the metal and the alloy material may include nickel, iron, lead, platinum, titanium, copper, molybdenum, zinc, or any combination thereof. In some embodiments, the alloy material may include copper-zinc alloy, copper-tin alloy, copper-nickel-silicon alloy, copper-chromium alloy, copper-silver alloy, etc., or any combination thereof. In some embodiments, the metal oxide material may include $RuO_2$, $MnO_2$, $PbO_2$, NiO, etc., or any combination thereof.

When relative motion occurs between the laminated structure and the base structure 110, deformation degree of the vibration unit 130 (e.g., the first elastic layer 131 or the second elastic layer 132) in the laminated structure at different positions may be different, i.e., different positions of the vibration unit 130 may have different deformation stresses on the piezoelectric layer 122 of the acoustic transducer unit 120. In some embodiments, in order to improve a sensitivity of the bone conduction sound transmission device, the acoustic transducer unit 120 may only be arranged at a position where the deformation degree of the vibration unit 130 is large, thereby improving a signal noise ratio (SNR) of the bone conduction sound transmission device 100. Correspondingly, an area of the first electrode layer 121, the piezoelectric layer 122, and/or the second electrode layer 123 of the acoustic transducer unit 120 may be less than or equal to an area of the vibration unit 130. In some embodiments, in order to further improve the SNR of the bone conduction sound transmission device 100, an area covered by the acoustic transducer unit 120 on the vibration unit 130 may be less than or equal to ½ of an area of the vibration unit 130. Preferably, the area covered by the acoustic transducer unit 120 on the vibration unit 130 may be less than or equal to ⅓ of the area of the vibration unit 130. Further preferably, the area covered by the acoustic transducer unit 120 on the vibration unit 130 may be less than or equal to ¼ of the area of the vibration unit 130. Further, in some embodiments, the position of the acoustic transducer unit 120 may be close to a connection between the laminated structure and the base structure 110. The deformation degree of the vibration unit 130 (e.g., the elastic layer) may be large when the vibration unit is subjected to an external force near the connection between the laminated structure and the base structure 110. The deformation stress of the acoustic transducer unit 120 may also be large near the connection between the laminated structure and the base structure 110. The acoustic transducer unit 120 may be arranged in a region with a large deformation stress to improve the SNR of the bone conduction sound transmission device 100 on the basis of improving the sensitivity of the bone conduction sound transmission device 100. It should be noted that the acoustic transducer unit 120 near the connection between the laminated structure and the base structure 110 may be relative to the free end of the laminated structure. That is to say, the distance from the acoustic transducer unit 120 to the connection between the laminated structure and the base structure 110 may be less than the distance from the acoustic transducer unit 120 to the free end of the laminated structure. In some embodiments, the sensitivity and the SNR of the bone conduction sound transmission device 100 may be improved only by adjusting the area and the position of the piezoelectric layer 122 in the acoustic transducer unit 120. For example, the first electrode layer 121 and the second electrode layer 123 may fully or partially cover the surface of the vibration unit 130, and the area of the piezoelectric layer 122 may be less than or equal to the area of the first electrode layer 121 or the second electrode layer 123. In some embodiments, the area covered by piezoelectric layer 122 on the first electrode layer 121 or the second electrode layer 123 may be less than or equal to ½ of the area of the first electrode layer 121 or the second electrode layer 123. Preferably, the area covered by the piezoelectric layer 122 on the first electrode layer 121 or the second electrode layer 123 may be less than or equal to ⅓ of the area of the first electrode layer 121 or the second electrode layer 123. Further preferably, the area covered by the piezoelectric layer 122 on the first electrode layer 121 or the second electrode layer 123 may be less than or equal to ¼ of the area of the first electrode layer 121 or the second electrode layer 123. In some embodiments, in order to prevent short circuit caused by the connecting between the first electrode layer 121 and the second electrode layer 123, the area of the first electrode layer 121 may be less than the area of the piezoelectric layer 122 or the second electrode layer 123. For example, the area of the piezoelectric layer 122, the second electrode layer 123, and the vibration unit 130 may be the same, and the area of the first electrode layer 121 may be less than the area of the vibration unit 130 (e.g., the elastic layer), the piezoelectric layer 122, or the second electrode layer 123. In this case, the entire region of the first electrode layer 121 may be located on the surface of the piezoelectric layer 122, and the edge of the first electrode layer 121 may have a certain distance from the edge of the piezoelectric layer 122, so that the first electrode layer 121 may avoid the region with poor material quality at the edge of the piezoelectric layer 122 to further improve the SNR of the bone conduction sound transmission device 100.

In some embodiments, in order to increase the output electrical signal and improve the SNR of the bone conduction sound transmission device, the piezoelectric layer 122 may be located on one side of a neutral layer of the laminated structure. The neutral layer may refer to a plane layer whose deformation stress is approximately zero when deformation occurs in the laminated structure. In some embodiments, the SNR of the bone conduction sound transmission device may also be improved by adjusting (e.g., increasing) the stress and stress variation gradient of the piezoelectric layer 122 per unit thickness. In some embodiments, the SNR and the sensitivity of the bone conduction sound transmission device 100 may be improved by adjusting the shape, thickness, material, and size (e.g., length, width, and thickness) of the acoustic transducer unit 120 (e.g., the first electrode layer 121, the piezoelectric layer 122, and the second electrode layer 123) and the vibration unit 130 (e.g., the first elastic layer 131, the second elastic layer 132).

In some embodiments, in order to control the warping deformation of the laminated structure, it is necessary to balance the stress of each layer in the laminated structure, so that upper and lower parts of the neutral layer of the cantilever beam may be subjected to the stress (e.g., tensile stress, and compressive stress) with same type and size. For example, when the piezoelectric layer 122 is an AlN material layer, the piezoelectric layer 122 may be arranged on one side of the neutral layer of the cantilever beam. In general, the stress of the AlN material layer may be the tensile stress, and the comprehensive stress of the elastic layer on the other side of the neutral layer may also be the tensile stress.

In some embodiments, the acoustic transducing unit 120 may further include a seed layer (not shown in the figure) for providing a good growth surface structure for other layers. The seed layer may be located on the lower surface of the second electrode layer 123. In some embodiments, the material of the seed layer may be the same as that of the piezoelectric layer 122. For example, when the material of the piezoelectric layer 122 is AlN, the material of the seed layer may also be AlN. It should be noted that when the acoustic transducer unit 120 is located on the lower surface of the second electrode layer 123, the seed layer may be located on the upper surface of the first electrode layer 121. Further, when the acoustic transducer unit 120 includes the seed layer, the vibration unit 130 (e.g., the first elastic layer 131 and the second elastic layer 132) may be located on the surface of the seed layer away from the piezoelectric layer 122. In some embodiments, the material of the seed layer may also be different from that of the piezoelectric layer 122.

It should be noted that the shape of the laminated structure may not be limited to the rectangle in FIG. 1, and may also be regular or irregular shapes such as a triangle, a trapezoid, a circle, a semicircle, a ¼ circle, an ellipse, a semi-ellipse, etc., which is not further limited herein. In addition, the number of the laminated structures is not limited to one in FIG. 1, and may also be 2, 3, 4, or more. Different laminated structures may be suspended side by side in the hollow part of the base structure, or may be suspended in the hollow part of the base structure in sequence along an arrangement direction of each layer of the laminated structure.

Figure 3:
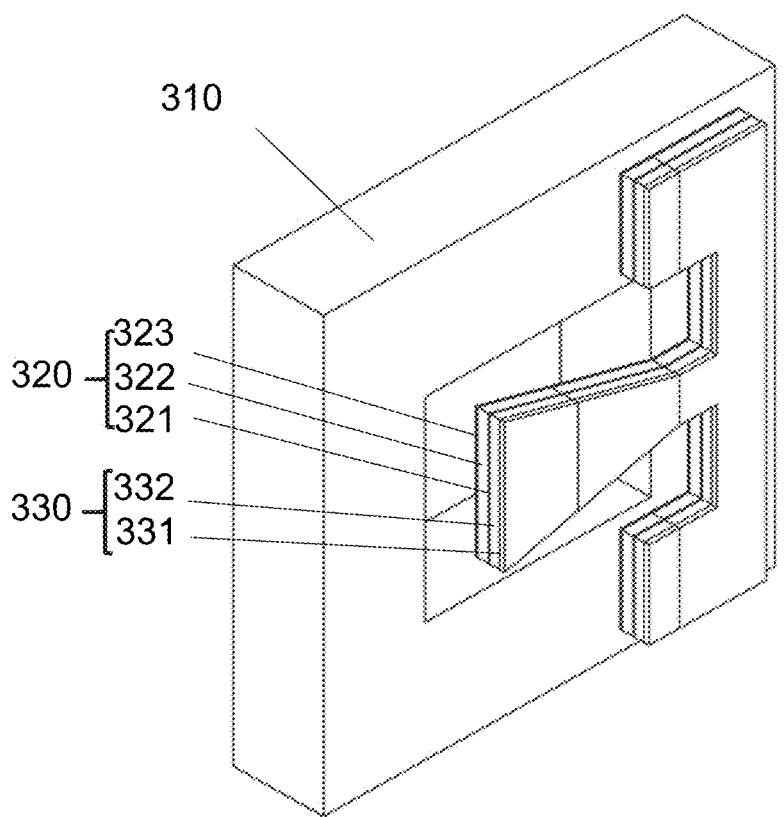
FIG. 3 is a schematic structural diagram illustrating another bone conduction sound transmission device according to some embodiments of the present disclosure.

FIG. 3 is a schematic structural diagram illustrating another bone conduction sound transmission device according to some embodiments of the present disclosure. The bone conduction sound transmission device 300 in FIG. 3 may be substantially the same as the bone conduction sound transmission device 100 in FIG. 1. The main difference is that the shape of the laminated structure of the bone conduction sound transmission device 300 in FIG. 3 is different. As shown in FIG. 3, the bone conduction sound transmission device 300 may include a base structure 310 and a laminated structure. The shape of the laminated structure may be trapezoidal. Further, a width of the laminated structure in the bone conduction sound transmission device 300 may gradually decrease from a free end to a fixed end. In other embodiments, the width of the laminated structure in the bone conduction sound transmission device 300 may gradually increase from the free end to the fixed end. It should be noted that the structure of the base structure 310 is similar to that of the base structure 110, and the structure of the vibration unit 330 is similar to that of the vibration unit 130. For details about the first electrode 321, the piezoelectric layer 322, and the second electrode 323 in the acoustic transducer unit 320, and the first elastic layer 331 and the second elastic layer 332 in the vibration unit 330, please refer to the contents of each layer of the acoustic transducer unit 120 and the vibration unit 130 in FIG. 1. In addition, other components (e.g., the seed layer) in the acoustic transducer unit 120 and the vibration unit 130 may also be applicable to the bone conduction sound transmission device 300 in FIG. 3, which is not repeated herein.

Figure 4:
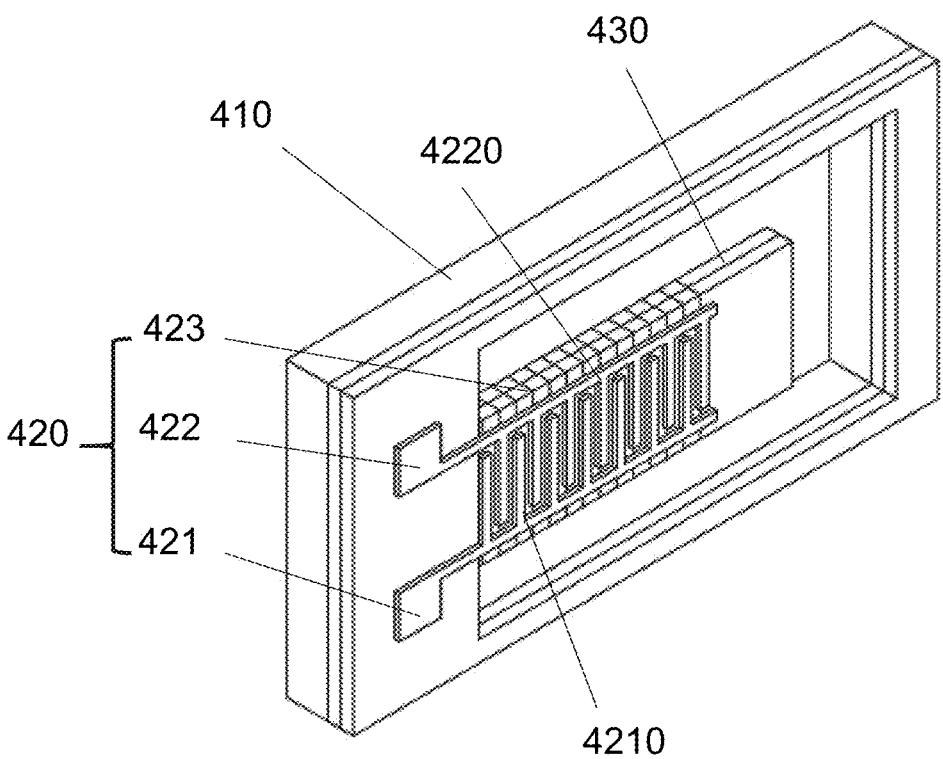
FIG. 4 is a schematic structural diagram illustrating a bone conduction sound transmission device according to other embodiments of the present disclosure.

FIG. 4 is a schematic structural diagram illustrating a bone conduction sound transmission device according to some embodiments of the present disclosure. As shown in FIG. 4, the bone conduction sound transmission device 400 may include a base structure 410 and a laminated structure, and at least part of the laminated structure may be connected to the base structure 410. In some embodiments, the base structure 410 may be a hollow frame structure, and a part of the laminated structure (e.g., an end of the laminated structure away from a connection between the base structure 410 and the laminated structure) may be located in a hollow part of the hollow frame structure. It should be noted that the frame structure may not be limited to the cuboid in FIG. 4. In some embodiments, the frame structure may be a regular or irregular structure such as a prism or a cylinder, etc. In some embodiments, the laminated structure may be fixedly connected to the base structure 410 in the form of a cantilever beam. Further, the laminated structure may include a fixed end and a free end. The fixed end of the laminated structure may be fixedly connected to the frame structure, and the free end of the laminated structure may not be connected or contacted with the frame structure, so that the free end of the laminated structure may be suspended in the hollow part of the hollow frame structure. In some embodiments, the fixed end of the laminated structure may be connected to an upper surface or a lower surface of the base structure 410, or a side wall where the hollow part of the base structure 410 is located. In some embodiments, the side wall where the hollow part of the base structure 410 is located may also be provided with a mounting groove adapted to the fixed end of the laminated structure, so that the fixed end of the laminated structure and the base structure 410 may be connected in a cooperated manner. The "connection" here may be understood as fixedly connecting the laminated structure and the base structure 410 by means of welding, riveting, clipping, bolts, etc. after preparing the laminated structure and the base structure 410 respectively. In some embodiments, the laminated structure may also be deposited on the base structure 410 by physical deposition (e.g., physical vapor deposition) or chemical deposition (e.g., chemical vapor deposition) during the preparation process. In some embodiments, one or more laminated structures may be arranged on the base structure 410. For example, the number of the laminated structures may be 1, 2, 3, 7, etc. Further, the plurality of the laminated structures may be equidistantly and evenly arranged along a circumferential direction of the base structure 410, or may be unevenly arranged along a circumferential direction of the base structure 410.

In some embodiments, the laminated structure may include an acoustic transducer unit 420 and a vibration unit 430. The vibration unit 430 may be located on an upper surface or a lower surface of the acoustic transducer unit 420. In some embodiments, the vibration unit 430 may include at least one elastic layer. The elastic layer may be a plate-shaped structure made of a semiconductor material. In some embodiments, the semiconductor material may include silicon dioxide, silicon nitride, gallium nitride, zinc oxide, silicon carbide, etc. In some embodiments, the acoustic transducer unit 420 may include an electrode layer and a piezoelectric layer 423. The electrode layer may include a first electrode 421 and a second electrode 422. In the embodiments of the present disclosure, the piezoelectric layer 423 may generate a voltage (potential difference) under a deformation stress of the vibration unit 430 based on piezoelectric effect. The first electrode 421 and the second electrode 422 may export the voltage (electrical signal). In some embodiments, the first electrode 421 and the second electrode 422 may be arranged on the same surface (e.g., the upper surface or the lower surface) of the piezoelectric layer 423 at intervals. The electrode layer and the vibration unit 430 may be located on different surfaces of the piezoelectric layer 423. For example, when the vibration unit 430 is located on the lower surface of the piezoelectric layer 423, the electrode layer (the first electrode 421 and the second electrode 422) may be located on the upper surface of the piezoelectric layer 423. As another example, when the vibration unit 430 is located on the upper surface of the piezoelectric layer 423, the electrode layer (the first electrode 421 and the second electrode 422) may be located on the lower surface of the piezoelectric layer 423. In some embodiments, the electrode layer and the vibration unit 430 may also be located on the same side of the piezoelectric layer 423. For example, the electrode layer may be located between the piezoelectric layer 423 and the vibration unit 430. In some embodiments, the first electrode 421 may be bent into a first comb-shaped structure 4210. The first comb-shaped structure 4210 may include multiple comb structures. There is a first spacing between the adjacent comb structures of the first comb-shaped structure 4210, and the first spacing may be the same or different. The second electrode 422 may be bent into a second comb-shaped structure 4220. The second comb-shaped structure 4220 may include multiple comb structures. There is a second spacing between adjacent comb structures of the second comb-shaped structure 4220, and the second spacing may be the same or different. The first comb-shaped structure 4210 and the second comb-shaped structure 4220 may be matched to form the electrode layer. Further, the comb structures of the first comb-shaped structure 4210 may extend into the second spacing of the second comb-shaped structure 4220, and the comb structures of the second comb-shaped structure 4220 may extend into the first spacing of the first comb-shaped structure 4210, so as to match with each other to form the electrode layer. The first comb-shaped structure 4210 and the second comb-shaped structure 4220 may match with each other, so that the first electrode 421 and the second electrode 422 are arranged compactly, but do not intersect. In some embodiments, the first comb-shaped structure 4210 and the second comb-shaped structure 4220 extend along a length direction (e.g., a direction from the fixed end to the free end) of a cantilever beam. In some embodiments, the piezoelectric layer 423 may be preferably piezoelectric ceramic material. When the piezoelectric layer 423 is the piezoelectric ceramic material, a polarization direction of the piezoelectric layer 423 may be consistent with the length direction of the cantilever beam. The output signal may be greatly enhanced and the sensitivity may be improved based on the characteristic of piezoelectric constant d33. The piezoelectric constant d33 may refer to a proportionality constant for converting mechanical energy into electrical energy by the piezoelectric layer. It should be noted that the piezoelectric layer 423 in FIG. 4 may also be made of other materials. When the polarization direction of the piezoelectric layer 423 made of other materials is consistent with the thickness direction of the cantilever beam, the acoustic transducer unit 120 in FIG. 1 may be replaced by the acoustic transducer unit 420.

When relative motion occurs between the laminated structure and the base structure 410, deformation degree of the vibration unit 430 in the laminated structure may be different at different positions. That is to say, different positions of the vibration unit 430 may have different deformation stresses on the piezoelectric layer 423 of the acoustic transducer unit 420. In some embodiments, in order to improve the sensitivity of the bone conduction sound transmission device, the acoustic transducer unit 420 may only be arranged at a position where the deformation degree of the vibration unit 430 is larger, thereby improving the SNR of the bone conduction sound transmission device 400. Correspondingly, an area of the electrode layer and/or the piezoelectric layer 423 of the acoustic transducer unit 420 may be less than or equal to an area of the vibration unit 430. In some embodiments, in order to further improve the SNR of the bone conduction sound transmission device 400, the area covered by the acoustic transducer unit 420 on the vibration unit 430 may be less than the area of the vibration unit 430. Preferably, the area covered by the acoustic transducer unit 420 on the vibration unit 430 may be less than or equal to ½ of the area of the vibration unit 430. Preferably, the area covered by the acoustic transducer unit 420 on the vibration unit 430 may be less than or equal to ⅓ of the area of the vibration unit 430. Further preferably, the area covered by the acoustic transducer unit 420 on the vibration unit 430 may be less than or equal to ¼ of the area of the vibration unit 430. Further, in some embodiments, the acoustic transducer unit 420 may be close to a connection between the laminated structure and the base structure 410. The deformation degree of the vibration unit 430 (e.g., the elastic layer) may be large when the vibration unit 430 is subjected to an external force near the connection between the laminated structure and the base structure 410. The deformation stress of the acoustic transducer unit 420 may also be large near the connection between the laminated structure and the base structure 410. Therefore, the acoustic transducer unit 420 may be arranged in a region with a large deformation stress to improve the SNR of the bone conduction sound transmission device 400 on the basis of improving the sensitivity of the bone conduction sound transmission device 400. It should be noted that the acoustic transducer unit 420 near the connection between and the laminated structure 410 may be relative to the free end of the laminated structure. That is to say, the distance from the acoustic transducer unit 420 to the connection between the laminated structure and the base structure 410 may be less than the distance from the acoustic transducer unit 420 to the free end. In some embodiments, the sensitivity and the SNR of the bone conduction sound transmission device 100 may be improved only by adjusting the area and the position of the piezoelectric layer 423 in the acoustic transducer unit 420. For example, the electrode layer may completely or partially cover the surface of the vibration unit 430, and the area of the piezoelectric layer 423 may be less than or equal to the area of the electrode layer. Preferably, the area covered by the piezoelectric layer 423 on the vibration unit 130 may be less than or equal to ½ of the area of the electrode layer. Preferably, the area covered by the piezoelectric layer 423 on the vibration unit 430 may be less than or equal to ⅓ of the area of the piezoelectric layer. Further preferably, the area covered by the piezoelectric layer 423 on the vibration unit 430 may be less than or equal to ¼ of the area of the electrode layer. In some embodiments, the area of the piezoelectric layer 423 may be the same as the area of the vibration unit 430, the entire region of the electrode layer may be located on the piezoelectric layer 423, and the edge of the electrode layer may have a certain distance from the edge of the piezoelectric layer 423, so that the first electrode 421 and the second electrode 422 in the electrode layer may avoid from the area with poor material quality at the edge of the piezoelectric layer 423, thereby further improving the SNR of the bone conduction sound transmission device 400.

In some embodiments, the shape, thickness, material, and size (e.g., length, width, and thickness) of the acoustic transducer unit 420 (e.g., the first electrode 421, the piezoelectric layer 423, and the second electrode 422), and the vibration unit 430 (e.g., the elastic layer) may be adjusted to increase the output electrical signal and improve the SNR and the sensitivity of the bone conduction sound transmission device 400.

In some embodiments, the length and width of a single comb structure of the first comb-shaped structure 4210 and the second comb-shaped structure 4220, the spacing between the comb structures (e.g., the first spacing and the second spacing), and the length of the entire acoustic transducer unit 420 may also be adjusted to increase the output voltage electrical signal and improve the SNR of the bone conduction sound transmission device.

Figure 5:
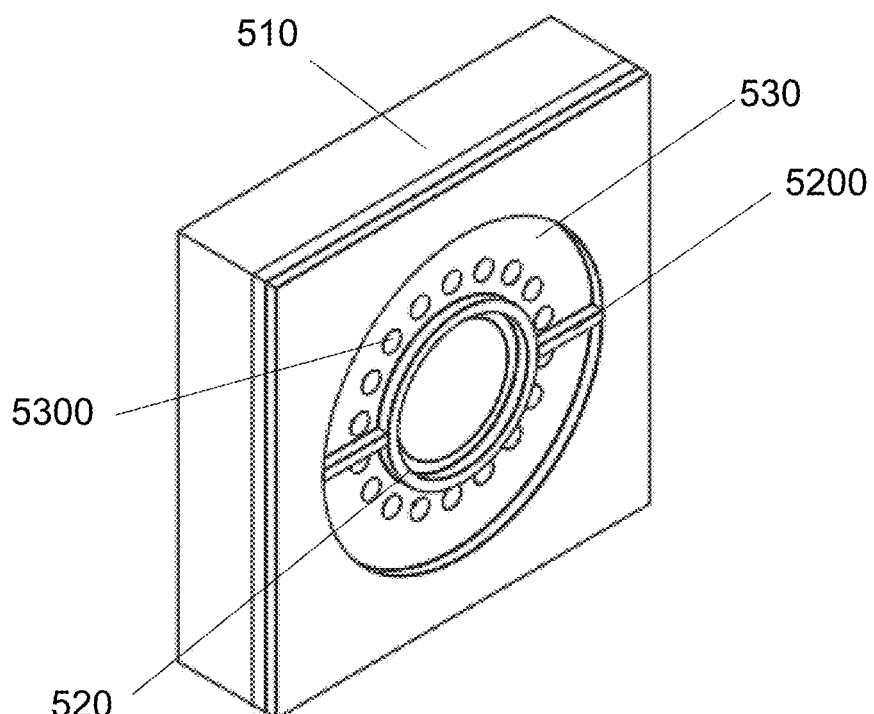
FIG. 5 is a schematic structural diagram illustrating a bone conduction sound transmission device according to some embodiments of the present disclosure.
Figure 6:
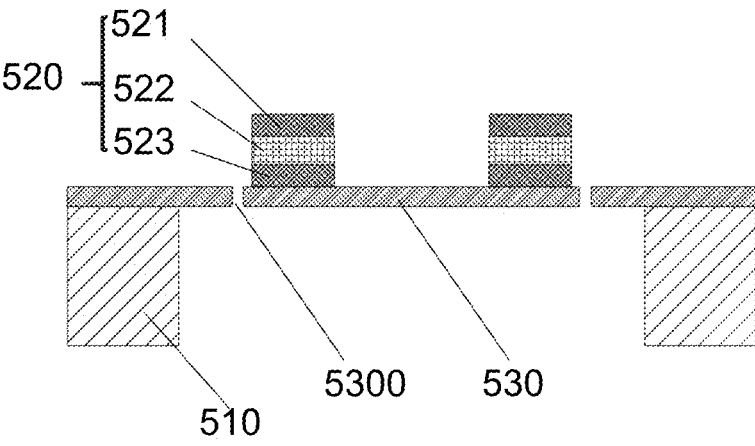
FIG. 6 is a sectional view of a partial structure of the bone conduction sound transmission device in FIG. 5 according to some embodiments of the present disclosure.

FIG. 5 is a schematic structural diagram illustrating a bone conduction sound transmission device according to some embodiments of the present disclosure. FIG. 6 is a sectional view of a partial structure of a bone conduction sound transmission device in FIG. 5 according to some embodiments of the present disclosure. As shown in FIGS. 5 and 6, the bone conduction sound transmission device 500 may include a base structure 510 and a laminated structure, and at least part of the laminated structure may be connected to the base structure 510. In some embodiments, the base structure 510 may be a hollow frame structure, and part of the laminate structure may be located in a hollow part of the hollow frame structure. It should be noted that the frame structure may not be limited to the cuboid in FIG. 5. In some embodiments, the frame structure may be a regular or irregular structure such as a prism or a cylinder, etc.

In some embodiments, the laminated structure may include an acoustic transducer unit 520 and a vibration unit. In some embodiments, the vibration unit may be arranged on an upper surface or a lower surface of the acoustic transducer unit 520. As shown in FIG. 5, the vibration unit may include a suspension membrane structure 530. The suspension membrane structure 530 may be fixed on the base structure 510 by connecting a peripheral side of the suspension membrane structure to the base structure 510. A central region of the suspension membrane structure 530 may be suspended in the hollow part of the base structure 510. In some embodiments, the suspension membrane structure 530 may be located on the upper surface or the lower surface of the base structure 510. In some embodiments, the peripheral side of the suspension membrane structure 530 may also be connected to an inner wall of the hollow part of the base structure 510. The "connection" here may be understood as fixing the suspension membrane structure 530 to the upper surface or the lower surface of the base structure, or a side wall of the hollow part of the base structure 510 by mechanical fixing (e.g., strong bonding, riveting, clamping, inlaying, etc.) after preparing the suspension membrane structure 530 and the base structure 510 respectively, or depositing the suspension membrane structure 530 on the base structure 510 by physical deposition (e.g., physical vapor deposition) or chemical deposition (e.g., chemical vapor deposition) during the preparation process. In some embodiments, the suspension membrane structure 530 may include at least one elastic layer. The elastic layer may be a membrane-shaped structure made of semiconductor material. In some embodiments, the semiconductor material may include silicon dioxide, silicon nitride, gallium nitride, zinc oxide, silicon carbide, etc. In some embodiments, the shape of the suspension membrane structure 530 may be a polygon such as a circle, an ellipse, a triangle, a quadrangle, a pentagon, a hexagon, or any other shape.

In some embodiments, the acoustic transducer unit 520 may be located on the upper surface or the lower surface of the suspension membrane structure 530. In some embodiments, the suspension membrane structure 530 may include a plurality of holes 5300 distributed around the center of the acoustic transducer unit 520 along a circumferential direction of the acoustic transducer unit 520. It may be understood that by setting the plurality of holes 5300 on the suspension membrane structure 530, stiffnesses of the suspension membrane structure 530 may be adjusted at different positions, so that the stiffness of the suspension membrane structure 530 in the region near the plurality of holes 5300 may be reduced, and the stiffness of the suspension membrane structure 530 away from the plurality of holes 5300 may be relatively large. When relative motion occurs between the suspension membrane structure 530 and the base structure 510, the deformation degree of the suspension membrane structure 530 in the region near the plurality of holes 5300 may be relatively large, and the deformation degree of the suspension membrane structure 530 away from the region of the plurality of holes 5300 may be small. At this time, the acoustic transducer unit 520 may be arranged in the region of the suspension membrane structure near the plurality of holes 5300, which may be conducive to collection of vibration signal by the acoustic transducer unit 520, thereby effectively improving the sensitivity of the bone conduction sound transmission device 500. Meanwhile, the structure of each component in the bone conduction sound transmission device 500 may be relatively simple, which is convenient for production or assembly. In some embodiments, the holes 5300 in the suspension membrane structure 530 may be in any shape such as a circular hole, an elliptical hole, a square hole, or other polygonal holes. In some embodiments, a resonant frequency (making the resonant frequency to be within a range of 2 kHz-5 kHz) and a stress distribution of the bone conduction sound transmission device 500 may also be adjusted by changing the size, quantity, spacing distance, and position of the plurality of holes 5300, so as to improve the sensitivity of the bone conduction sound transmission device 500. It should be noted that the resonant frequency may not be limited to be within the above-mentioned range of 2 kHz-5 kHz, but may also be within a range of 3 kHz-4.5 kHz or 4 kHz-4.5 kHz. The range of the resonant frequency may be adjusted according to different application scenarios, which is not further limited herein.

Combined with FIGS. 5 and 6, in some embodiments, the acoustic transducer unit 520 may include a first electrode layer 52, a piezoelectric layer 522, and a second electrode layer 523 arranged in sequence from top to bottom. The position of the first electrode layer 521 and the position of the second electrode layer 523 may be interchanged. The piezoelectric layer 522 may generate a voltage (potential difference) under a deformation stress of the vibration unit (e.g., the suspension membrane structure 530) based on piezoelectric effect. The first electrode layer 521 and the second electrode layer 523 may export the voltage (electrical signal). In some embodiments, material of the piezoelectric layer may include piezoelectric crystal material and piezoelectric ceramic material. The piezoelectric crystal may refer to a piezoelectric monocrystal. In some embodiments, the piezoelectric crystal material may include crystal, sphalerite, boborite, tourmaline, zincite, GaAs, barium titanate and its derivative structure crystals, $KH_2PO_4$, $NaKC_4H_4O_6 \cdot 4H_2O$ (Rochelle salt), sugar, etc., or any combination thereof. The piezoelectric ceramic material may refer to a piezoelectric polycrystal prepared by random collection of fine grains obtained by solid-state reaction and sintering between different material powders. In some embodiments, the piezoelectric ceramic material may include barium titanate (BT), lead zirconate titanate (PZT), lead barium lithium niobate (PBLN), modified lead titanate (PT), aluminum nitride (AlN), zinc oxide (ZnO), etc., or any combination thereof. In some embodiments, the piezoelectric layer 522 may also be a piezoelectric polymer material, such as polyvinylidene fluoride (PVDF). In some embodiments, the first electrode layer 521 and the second electrode layer 523 may have a conductive material structure. Exemplarily, the conductive material may include metal, alloy material, metal oxide material, graphene, etc., or any combination thereof. In some embodiments, the metal and the alloy material may include nickel, iron, lead, platinum, titanium, copper, molybdenum, zinc, etc., or any combination thereof. In some embodiments, the alloy material may include a copper-zinc alloy, a copper-tin alloy, a copper-nickel-silicon alloy, a copper-chromium alloy, a copper-silver alloy, etc., or any combination thereof. In some embodiments, the metal oxide material may include $RuO_2$, $MnO_2$, $PbO_2$, NiO, etc., or any combination thereof.

As shown in FIG. 5, in some embodiments, the plurality of holes 5300 may enclose a circular region. In order to improve an acoustic pressure output effect of the acoustic transducer unit 520, the acoustic transducer unit 520 may be arranged in a region of the suspension membrane structure 530 near the plurality of holes. Further, the acoustic transducer unit 520 may be a ring structure distributed along an inner side of the circular region enclosed by the plurality of holes 5300. In some embodiments, the acoustic transducer unit 520 in the ring structure may also be distributed along an outer side of the circular region enclosed by the plurality of holes 5300. In some embodiments, the piezoelectric layer 522 of the acoustic transducer unit 520 may be a piezoelectric ring. The first electrode layer 521 and the second electrode layer 523 located on the upper surface and the lower surface of the piezoelectric ring may be electrode rings. In some embodiments, the acoustic transducer unit 520 may be further provided with a lead structure 5200, which may be used to transmit electrical signal collected by the electrode rings (e.g., the first electrode layer 521 and the second electrode layer 523) to a subsequent circuit. In some embodiments, in order to improve an output electrical signal of the bone conduction sound transmission device 500, a radial distance from an edge of the acoustic transducer unit 520 (e.g., the ring structure) to the center of each hole 5300 may be within a range of 100 μm-400 μm. Preferably, the radial distance from the edge of the acoustic transducer unit 520 (e.g., the ring structure) to the center of each hole 5300 may be within a range of 150 μm-300 μm. Further preferably, the radial distance from the edge of the acoustic transducer unit 520 (e.g., the ring structure) to the center of each hole 5300 may be within a range of 150 μm-250 μm.

In some embodiments, the output electrical signal of the bone conduction sound transmission device 500 may also be improved by adjusting the shape, size (e.g., length, width, and thickness) and material of the lead structure 5200.

In alternative embodiments, the deformation stress of the suspension membrane structure 530 may also be changed at different positions by adjusting a thickness or density of different regions of the suspension membrane structure 530. For illustrative purposes only, in some embodiments, the acoustic transducer unit 520 may be set as the ring structure. The thickness of the suspension membrane structure 530 located on an inner region of the ring structure may be greater than the thickness of the suspension membrane structure 530 located on an outer region of the ring structure. In some embodiments, the density of the suspension membrane structure 530 located on the inner region of the ring structure may be greater than the density of the suspension membrane structure 530 located on the outer region of the ring structure. By changing the density or thickness of the suspension membrane structure 530 at different positions, the mass of the suspension membrane located on the inner region of the ring structure may be greater than the mass of the suspension membrane located on the outer region of the ring structure. When relative motion occurs between the suspension membrane structure 530 and the base structure 510, the deformation degree of the suspension membrane structure 530 near the ring structure of the acoustic transducer unit 520 may be large and the generated deformation stress is large, thereby improving the output electrical signal of the bone conduction sound transmission device 500.

It should be noted that the shape of the region enclosed by the plurality of holes 5300 may not limited to the circle in FIG. 5, and may also be other regular or irregular shapes, such as a semicircle, a quarter circle, an elliptical, a half elliptical, a triangle, a rectangle, etc. The shape of the acoustic transducer unit 520 may be adaptively adjusted according to the shape of the region enclosed by the plurality of holes 5300. For example, when the shape of the region enclosed by the plurality of holes 5300 is the rectangle, the shape of the acoustic transducer unit 520 may be the rectangle. The rectangular acoustic transducer units 520 in the rectangular may be distributed along the inner side or the outer side of the rectangle enclosed by the plurality of holes 5300. As another example, when the shape of the region enclosed by the plurality of holes 5300 is the semicircle, the shape of the acoustic transducer unit 520 may be a semi-ring. The acoustic transducer unit 520 in semi-ring may be distributed along the inner side or the outer side of the rectangle enclosed by the plurality of holes 5300. In some embodiments, the suspension membrane structure 530 in FIG. 5 may have no hole.

Figure 7:
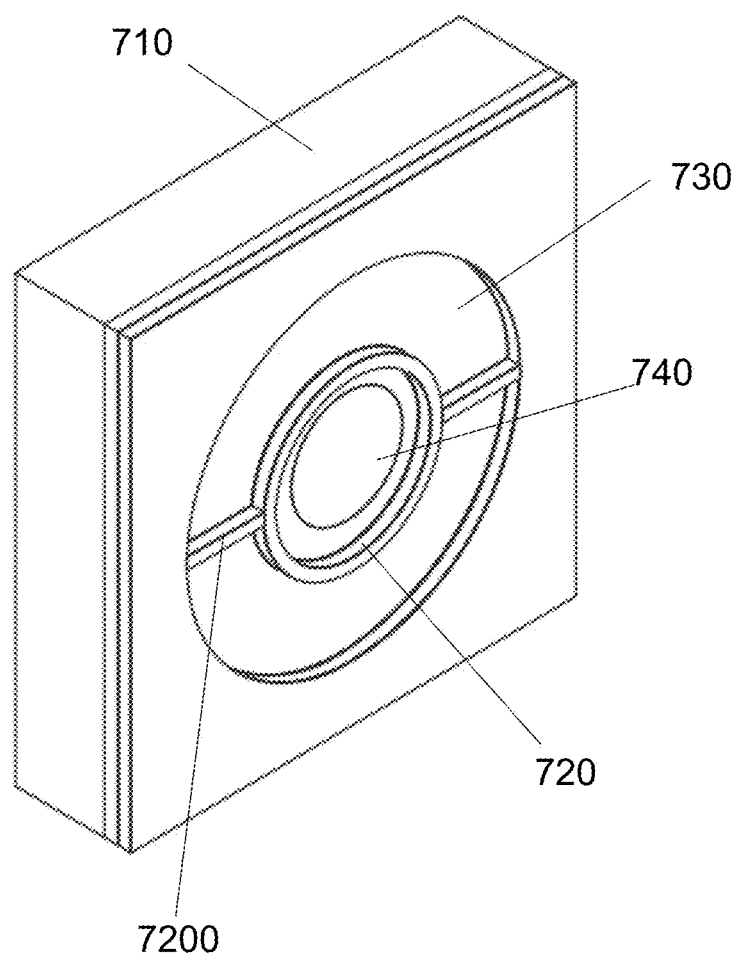
FIG. 7 is a schematic structural diagram illustrating a bone conduction sound transmission device according to some embodiments of the present disclosure.

FIG. 7 is a schematic structural diagram illustrating a bone conduction sound transmission device according to some embodiments of the present disclosure. The structure of the bone conduction sound transmission device 700 in FIG. 7 may be substantially the same as that of the bone conduction sound transmission device 500 in FIG. 5. The difference is that the vibration unit of the bone conduction sound transmission device 700 in FIG. 7 may include a suspension membrane structure 730 and a mass element 740.

As shown in FIG. 7, the bone conduction sound transmission device 700 may include a base structure 710 and a laminated structure, and at least part of the laminated structure may be connected to the base structure 710. In some embodiments, the base structure 710 may be a hollow frame structure, and part of the laminated structure may be located in a hollow part of hollow the frame structure. It should be noted that the frame structure may not be limited to the cuboid in FIG. 7. In some embodiments, the frame structure may be a regular or irregular structure such as a prism or a cylinder, etc.

In some embodiments, the laminated structure may include an acoustic transducer unit 720 and a vibration unit. In some embodiments, the vibration unit may be arranged on an upper surface or a lower surface of the acoustic transducer unit 720. As shown in FIG. 7, the vibration unit may include the suspension membrane structure 730 and the mass element 740. The mass element 740 may be located on the upper surface or the lower surface of the suspension membrane structure 730. In some embodiments, the suspension membrane structure 730 may be located on the upper surface or the lower surface of the base structure 710. In some embodiments, a peripheral side of the suspension membrane structure 730 may also be connected to an inner wall of the hollow part of the base structure 710. The "connection" here may be understood as fixing the suspension membrane structure 730 to the upper surface or the lower surface of the base structure 710, or a side wall of the hollow part of the base structure by means of mechanical fixing (e.g., strong bonding, riveting, clamping, inlaying, etc.) after preparing the suspension membrane structure 730 and the base structure 710 respectively, or depositing the suspension film structure 730 on the base structure 710 by physical deposition (e.g., physical vapor deposition) or chemical deposition (e.g., chemical vapor deposition) during the preparation process. When relative motion occurs between the vibration unit and the base structure 710, the weight of the mass element 740 and the weight of the suspension membrane structure 730 may be different, and a deformation degree of a region of the suspension membrane structure 730 where the mass element 740 is located or near the mass element 730 may be greater than a deformation degree of a region of the suspension membrane structure 730 away from the mass element. In order to increase an output acoustic pressure of the bone conduction sound transmission device 700, the acoustic transducer unit 720 may be distributed along a circumferential direction of the mass element 740. In some embodiments, the shape of the acoustic transducer unit 720 may be the same as or different from that of the mass element 740. Preferably, the shape of the acoustic transducer unit 720 may be the same as that of the mass element 740, so that each position of the acoustic transducer unit 720 may be close to the mass element 740, thereby further improving an output electrical signal of the bone conduction sound producing device 700. For example, the mass element 740 may be a cylindrical structure, and the acoustic transducer unit 720 may be a ring structure. An inner diameter of the acoustic transducer unit 720 in the ring structure may be greater than a radius of the mass element 740, so that the acoustic transducer unit 720 may be arranged along the circumferential direction of the mass element 740. In some embodiments, the acoustic transducer unit 720 may include a first electrode layer, a second electrode layer, and a piezoelectric layer located between the first electrode layer and the second electrode layer. The first electrode layer, the piezoelectric layer, and the second electrode layer may be combined to form a structure adapted to the mass element 740. For example, the mass element 740 may be the cylindrical structure, and the acoustic transducer unit 720 may be the ring structure. At this time, all of the first electrode layer, the piezoelectric layer, and the second electrode layer may be ring structures. The first electrode layer, the piezoelectric layer, and the second electrode layer may be arranged and combined in sequence from top to bottom to form the ring structure.

In some embodiments, the acoustic transducer unit 720 and the mass element 740 may be located on different sides of the suspension membrane structure 730, or located on the same side of the suspension membrane structure 730. For example, both the acoustic transducer unit 720 and the mass element 740 may be located on the upper surface or the lower surface of the suspension membrane structure 730. The acoustic transducer unit 720 may be distributed along the circumferential direction of the mass element 740. As another example, the acoustic transducer unit 720 may be located on the upper surface of the suspension membrane structure 730, and the mass element 740 may be located on the lower surface of the suspension membrane structure 730. At this time, a projection of the mass element 740 on the suspension membrane structure 730 may be within the region of the acoustic transducer unit 720.

In some embodiments, the output electrical signal of the bone conduction sound transmission device 700 may be improved by changing the size, shape, and position of the mass element 740 and the position, shape, and size of the piezoelectric layer. In some embodiments, the output acoustic pressure effect of the bone conduction sound transmission device 700 may also be improved by changing the shape, material, and size of the suspension membrane structure 730. Here, the structures and parameters of the first electrode layer, the second electrode layer, and the piezoelectric layer of the acoustic transducer unit 720 may be similar to the structure and parameters of the first electrode layer 521, the second electrode layer 523, and the piezoelectric layer 522 of the acoustic transducer unit 520 in FIG. 5, the structure and parameters of the suspension film structure 730 may be similar to the structures and parameters of the suspension film structure 530, and the structures of the lead structure 7200 may be similar to the structures of the lead structure 5200, which is not be further repeated herein.

Figure 8:
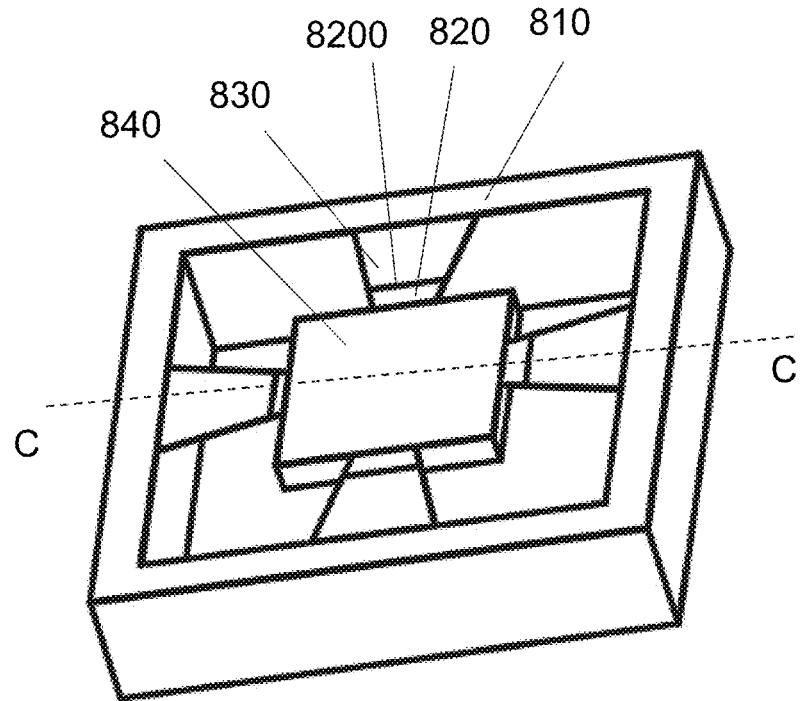
FIG. 8 is a schematic structural diagram of a bone conduction sound transmission device according to some embodiments of the present disclosure.
Figure 9:
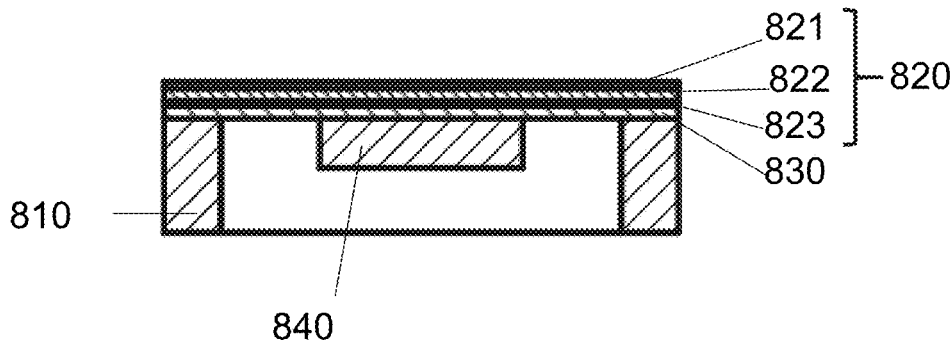
FIG. 9 is a sectional view of the bone conduction sound transmission device in FIG. 8 along a C-C axis according to some embodiments of the present disclosure.

FIG. 8 is a schematic structural diagram illustrating a bone conduction sound transmission device according to some embodiments of the present disclosure. FIG. 9 is a sectional view of the bone conduction sound transmission device in FIG. 8 along a C-C axis according to some embodiments of the present disclosure. As shown in FIG. 8, a base structure 810 may be a cuboid frame structure. In some embodiments, the interior of the base structure 810 may include a hollow part configured to place an acoustic transducer unit 820 and a vibration unit. In some embodiments, the shape of the hollow part may be a circle, a quadrangle (e.g., a rectangle, a parallelogram), a pentagon, a hexagon, a heptagon, an octagon, or other regular or irregular shapes. In some embodiments, the size of one edge of a rectangular cavity may be within a range of 0.8 mm-2 mm. Preferably, the size of one edge of the rectangular cavity may be within a range of 1 mm-1.5 mm. In some embodiments, the vibration unit may include four support arms 830 and a mass element 840. One end of each of the four support arms 830 may be connected to an upper surface or a lower surface of the base structure 810, or a side wall where the hollow part of the base structure 810 is located. The other end of each of the four support arms 830 may be connected to an upper surface, a lower surface, or a circumferential side wall of the mass element 840. In some embodiments, the mass element 840 may protrude upward and/or downward relative to the support arms 830. For example, when the ends of the four support arms 830 are connected to the upper surface of the mass element 840, the mass element 840 may protrude downward relative to the support arms 830. As another example, when the ends of the four support arms 830 are connected to the lower surface of the mass element 840, the mass element 840 may protrude upward relative to the support arms 830. As another example, when the ends of the four support arms 830 are connected to the circumferential side wall of the mass element 840, the mass element 840 may protrude upward and downward relative to the support arms 830. In some embodiments, the shape of each of the support arms 830 may be trapezoidal. The end of each of the support arms 830 with a small width may be connected to the mass element 840, and the end of each of the support arms 830 with a large width may be connected to the base structure 810.

In some embodiments, each of the support arms 830 may include at least one elastic layer. The elastic layer may be a plate-shaped structure made of a semiconductor material. In some embodiments, the semiconductor material may include silicon, silicon dioxide, silicon nitride, gallium nitride, zinc oxide, silicon carbide, etc. In some embodiments, the materials of different elastic layers of the support arms 830 may be the same or different. Further, the bone conduction sound transmission device 800 may include an acoustic transducer unit 820. The acoustic transducer unit 820 may include a first electrode layer 821, a piezoelectric layer 822, and a second electrode layer 823 arranged in sequence from top to bottom. The first electrode layer 821 or the second electrode layer 823 may be connected to the upper surface or the lower surface of each of the support arms 830 (e.g., the elastic layer). In some embodiments, when the support arms 830 includes a plurality of elastic layers, the acoustic transducer unit 820 may also be located among the plurality of elastic layers. The piezoelectric layer 822 may generate a voltage (potential difference) under a deformation stress of the vibration unit (e.g., the support arms 830 and the mass element 840) based on piezoelectric effect. The first electrode layer 821 and the second electrode layer 823 may export the voltage (electrical signal). In order to make a resonant frequency of the bone conduction sound transmission device 800 be within a specific frequency range (e.g., 2000 Hz-5000 Hz), the material and thickness of the acoustic transducer unit 820 (e.g., the first electrode layer 821, the second electrode layer 823, and the piezoelectric layer 822) and the vibration unit (e.g., the support arms 830) may be adjusted. In some embodiments, the acoustic transducer unit 820 may also include a wire bound electrode layer (PAD layer). The wire bound electrode layer may be located on the first electrode layer 821 and the second electrode layer 823. The first electrode layer 821 and the second electrode layer 823 may be connected to an external circuit through an external wiring (e.g., a gold wire, an aluminum wire, etc.), so as to lead a voltage signal between the first electrode layer 821 and the second electrode layer 823 to a back-end processing circuit. In some embodiments, material of the wire bound electrode layer may include copper foil, titanium, copper, etc. In some embodiments, a thickness of the wire bound electrode layer may be within a range of 100 nm-200 nm. Preferably, the thickness of the wire bound electrode layer may be within a range of 150 nm-200 nm. In some embodiments, the acoustic transducer unit 820 may further include a seed layer. The seed layer may be located between the second electrode layer 823 and the support arms 830. In some embodiments, the material of the seed layer may be the same as that of the piezoelectric layer 822. For example, when the material of the piezoelectric layer 822 is AlN, the material of the seed layer is also AlN. In some embodiments, the material of the seed layer may also be different from the material of the piezoelectric layer 822. It should be noted that the specific frequency range of the resonant frequency of the above-mentioned bone conduction sound transmission device 800 may not be limited to 2000 Hz-5000 Hz. The specific frequency range may also be 4000 Hz-5000 Hz, or 2300 Hz-3300 Hz, etc. The specific frequency range may be determined according to the actual situation. In addition, when the mass element 840 protrudes upward relative to the support arms 830, the acoustic transducer unit 820 may be located on the lower surface of the support arms 830, and the seed layer may be located between the mass element 840 and the support arms 830.

In some embodiments, the mass element 840 may be a single-layer structure or a multi-layer structure. In some embodiments, the mass element 840 may be the multi-layer structure. The number of layers of the mass element 840, and the materials and parameters corresponding to each layer structure may be the same as or different from those of the elastic layer of the support arms 830 and the acoustic transducer unit 820. In some embodiments, the shape of the mass element 840 may be a circle, a semicircle, an ellipse, a triangle, a quadrangle, a pentagon, a hexagon, a heptagon, an octagon, or other regular or irregular shapes. In some embodiments, the thickness of the mass element 840 may be the same as or different from the total thickness of the support arms 830 and the acoustic transducer unit 820. For the material and size of the mass element 840 when the mass element 840 is the multi-layer structure, please refer to the descriptions of the elastic layer of the support arms 830 and the acoustic transducer unit 820, which is not repeated herein. In addition, the material and parameters of each layer structure of the elastic layer and the acoustic transducer unit 820 may also be applied to the bone conduction sound transmission device in FIGS. 1, 3, 4, 5, and 7.

In some embodiments, the acoustic transducer unit 820 may at least include an effective acoustic transducer unit. The effective acoustic transducer unit may refer to a partial structure of the acoustic transducer unit that ultimately contributes an electrical signal. For example, the first electrode layer 821, the piezoelectric layer 822, and the second electrode layer 823 have the same shape and area, and partially cover the support arms 830 (the elastic layer), then the first electrode layer 821, the piezoelectric layer 822, and the second electrode layer may be effective acoustic transducer units. As another example, the first electrode layer 821 and the piezoelectric layer 822 partially cover the support arms 830, and the second electrode layer 823 completely covers the support arms 830, then the first electrode layer 821, the piezoelectric layer 822, and part of the second electrode layer 823 corresponding to the first electrode layer 821 may constitute the effective acoustic transducer unit. As another example, the first electrode layer 821 partially covers the support arms 830, and the piezoelectric layer 822 and the second electrode layer 823 completely cover the support arms 830, then the first electrode layer 821, part of the piezoelectric layer 822 corresponding to the first electrode layer 821, and part of the second electrode layer 823 corresponding to the first electrode layer 821 may constitute the effective transducer unit. As another example, the first electrode layer 821, the piezoelectric layer 822, and the second electrode layer 823 completely cover the support arms 830, but the first electrode layer 821 is divided into multiple independent electrodes by arranging insulated trenches (e.g., electrode insulated trenches 8200), then the independent electrode part of the first electrode layer 821 that leads out the electrical signal, the part of the piezoelectric layer 822 corresponding to the independent electrode part of the first electrode layer 821, and part of the second electrode layer 823 corresponding to the independent electrode part of the first electrode layer 821 may constitute the effective transducer unit. The independent electrode region in the first electrode layer 821 that does not lead out the electrical signal, a region of the piezoelectric layer 822 corresponding to the independent electrodes in the first electrode layer 821 that do not lead out the electrical signal and the insulated trenches, and a region of the second electrode layer 823 corresponding to the independent electrodes in the first electrode layer 821 that do not lead out the electrical signal do not provide the electrical signal, but mainly provide mechanical effect. In order to improve the SNR of the bone conduction sound transmission device 800, the effective acoustic transducer unit may be arranged at a position of the support arms 830 near the mass element 840 or near the connection between the support arms 830 and the base structure 810. Preferably, the effective acoustic transducer unit may be arranged at a position of the support arm 830 near the mass element 840. In some embodiments, when the effective acoustic transducer unit is arranged at the position of the support arms 830 near the mass element 840 or near the connection between the support arms 830 and the base structure 810, a ratio of a cover area of the effective acoustic transducer unit on the support arms 830 to an area of the support arms 830 may be within a range of 5%-40%. Preferably, the ratio of the cover area of the effective acoustic transducer unit on the support arms 830 to the area of the support arms 830 may be within a range of 10%-35%. Further preferably, the ratio of the cover area of the effective acoustic transducer unit on the support arms 830 to the area of the support arms 830 may be within a range of 15%-20%.

The SNR of the bone conduction sound transmission device 800 may be positively correlated with an intensity of the output electrical signal. When the laminated structure moves relative to the base structure, a deformation stress of the connection between the support arms 830 and the mass element 840 and a deformation stress of the connection between the support arms 830 and the base structure 810 may be relatively larger than a deformation stress of a middle region of the support arms 830. Correspondingly, an intensity of the output voltage at the connection between the support arms 830 and the mass element 840 and the connection between the support arms 830 and the base structure 810 may be relatively larger than an intensity of the output voltage in the middle region of the support arms 830. In some embodiments, when the acoustic transducer unit 820 completely or nearly completely covers the upper surface or the lower surface of the support arms 830, in order to improve the SNR of the bone conduction sound transmission device 800, the electrode insulated trench 8200 may be arranged on the first electrode layer 821. The electrode insulated trench 8200 may divide the first electrode layer 821 into two parts, so that a part of the first electrode layer 821 may be close to the mass element 840, and the other part of the first electrode layer 821 may be close to the connection between the support arms 830 and the base structure 810. The first electrode layer 821 and corresponding piezoelectric layer 822, and part of the two parts of second electrode layer 823 divided by the electrode insulated trench 8200 that leads out the electrical signal may be the effective acoustic transducer unit. In some embodiments, the electrode insulated trench 8200 may be a straight line extending along a width direction of the support arms 830. In some embodiments, a width of the electrode insulated trench 8200 may be within a range of 2 μm-20 μm. Preferably, the width of the electrode insulated trench 8200 may be within a range of 4 μm-10 μm.

It should be noted that the electrode insulated trench 8200 may not limited to the straight line extending along the width direction of the support arms 830, but may also be a curve, a bent line, a wavy line, etc. In addition, the electrode insulated trench 8200 may not extend along the width direction of the support arms 830, such as electrode insulated trench 8201 in FIG. 10. The electrode insulated trench 8200 only needs to divide the acoustic transducer unit 820 into multiple parts, which is not further limited herein.

Figure 10:
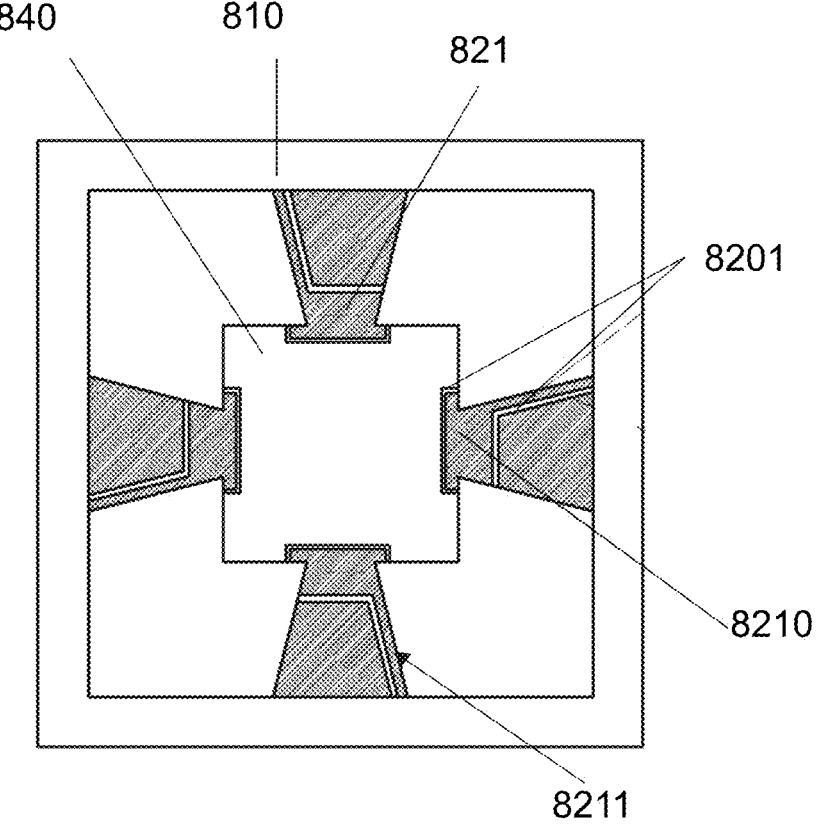
FIG. 10 is a schematic structural diagram illustrating a bone conduction sound transmission device according to some embodiments of the present disclosure.

As shown in FIG. 10, when the partial structure (e.g., the acoustic transducer unit between the electrode insulated trenches 8201 and the mass element 840 in FIG. 10) of the acoustic transducer unit 820 is arranged at a position of the support arms 830 close to the mass element 840, the first electrode layer 821 and/or the second electrode layer 823 may further include an electrode lead. Taking the first electrode layer 821 as an example, the electrode insulated trenches 8201 divide the first electrode layer 821 into two parts. A part of the first electrode layer 821 may be connected to the mass element 840 or may be close to the mass element 840, and the other part of the first electrode layer 821 may be close to the connection between the support arms 830 and the base structure 810. In order to output the voltage of the acoustic transducer unit 820 close to the mass element 840, a partial region may be divided from the first electrode layer close to the connection between the support arms 830 and the base structure 810 (the first electrode layer 821 located at the edge of the support arms 830 in the figure) through the electrode insulated trenches 8201. This partial region may electrically connect the part of the acoustic transducer unit 820 connected to the mass element 840 or close to the mass element 840 to a processing unit of the conduction microphone device 800. In some embodiments, a width of the electrode lead may be within a range of 4 μm-20 μm. Preferably, the width of the electrode lead may be within a range of 4 μm-10 μm. In some embodiments, the electrode lead may be located at any position in the width direction of the support arms 830. For example, the electrode lead may be located at the center of the support arm 830 or a position of the support arm 830 close to the edge in the width direction. Preferably, the electrode lead may be located a position of the support arms 830 near the edge in the width direction. The use of a conductive wire in the acoustic transducer unit 820 may be avoided by arranging the electrode lead 8211, and the structure of the acoustic transducer unit 820 may be relatively simple, which is convenient for subsequent production and assembly.

Considering that the piezoelectric material of the piezoelectric layer 822 may be roughened in the region near the edge of the support arm 830 due to etching, the quality of the piezoelectric material may be deteriorated. In some embodiments, when the area of the piezoelectric layer 822 is the same as the area of the second electrode layer 823, in order to make the first electrode layer 821 be located in the region of the piezoelectric layer with good piezoelectric material, the area of the piezoelectric layer 822 may be less than the area of the first electrode layer 821, so that the edge region of the first electrode layer 821 may avoid the edge region of the piezoelectric layer 822, and an electrode retraction trench (not shown in the figure) may be formed between the first electrode layer 821 and the piezoelectric layer 822. The first electrode layer 821 and the second electrode layer 823 may avoid the region of the piezoelectric layer 822 with poor edge quality by arranging the electrode retraction trench, thereby improving the SNR of the output signal of the bone conduction sound transmission device. In some embodiments, a width of the electrode retraction trench may be within a range of 2 μm-20 μm. Preferably, the width of the electrode retraction trench may be within a range of 2 μm-10 μm.

As shown in FIG. 10, taking the mass element 840 protruding downward relative to the support arms 830 as an example, the acoustic transducer unit 820 may further include an extension region 8210 extending along a length direction of the support arms 830. The extension region 8210 may be located on the upper surface of the mass element 840. In some embodiments, the electrode insulated trench 8201 may be arranged at the edge of the extension region 8210 located on the upper surface of the mass element 840 to prevent excessive stress concentration of the support arms 830, thereby improving the stability of the support arms 830. In some embodiments, a length of the extension region 8210 may be greater than a width of the support arms 830. Here, the length of the extension region 8210 may correspond to the width along the support arm 830. In some embodiments, the length of the extension region 8210 may be within a range of 4 μm-30 μm. Preferably, the length of the extension region 8210 may be within a range of 4 μm-15 μm. In some embodiments, the length of the extension region 8210 on the mass element 840 may be 1.2 times-2 times of the width of a connecting part between the support arm 830 and the edge of the mass element 840. Preferably, the length of the extension region 8210 on the mass element 840 may be 1.2 times-1.5 times of the width of the connecting part between the support arm 830 and the edge of the mass element 840.

Figure 11:
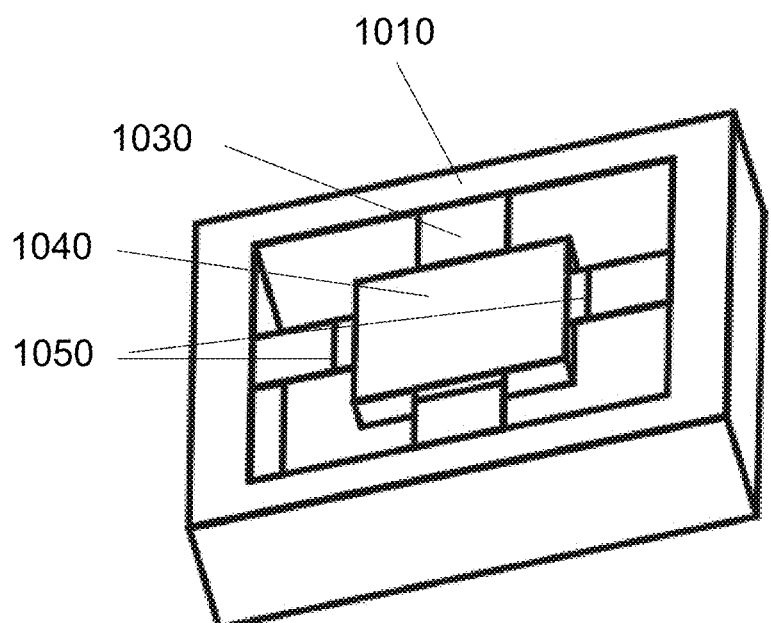
FIG. 11 is a schematic structural diagram illustrating a bone conduction sound transmission device according to some embodiments of the present disclosure.

FIG. 11 is a schematic structural diagram illustrating a bone conduction sound transmission device according to some embodiments of the present disclosure. The overall structure of the bone conduction sound transmission device 1000 in FIG. 11 may be substantially the same as that of the bone conduction sound transmission device 800 in FIG. 8. The difference is that the shape of the support arm is different. As shown in FIG. 11, a base structure 1010 may be a cuboid frame structure. In some embodiments, the interior of the base structure 1010 may include a hollow part configured to suspend an acoustic transducer unit and a vibration unit. In some embodiments, the shape of the hollow part may be a circle, a quadrangle (e.g., a rectangle, and a parallelogram), a pentagon, a hexagon, a heptagon, an octagon, or other regular or irregular shapes. In some embodiments, the vibration unit may include four support arms 1030 and a mass element 1040. One end of each of the four support arms 1030 may be connected to an upper surface or a lower surface of the base structure 1010, or a side wall where the hollow part of the base structure 1010 is located, and the other end of each of the four support arms 1030 may be connected to the upper surface, the lower surface, or a circumferential side wall of the mass element 1040. In some embodiments, the mass element 1040 may protrude upward and/or downward relative to the support arms 1030. For example, when the ends of the four support arms 1030 are connected to the upper surface of the mass element 1040, the mass element 1040 may protrude downward relative to the support arms 1030. As another example, when the ends of the four support arms 1030 are connected to the lower surface of the mass element 1040, the mass element 1040 may protrude upward relative to the support arms 1030. As another example, when the ends of the four support arms 1030 are connected to the circumferential side wall of the mass element 1040, the mass element 1040 may protrude upward and downward relative to the support arms 1030. In some embodiments, the shape of the support arms 1030 may be a rectangle. One end of each of the support arms 1030 may be connected to the mass element 1040, and the other end of each of the support arms 1030 may be connected to the base structure 1010.

In some embodiments, in order to improve the SNR of the bone conduction sound transmission device 1000, an effective acoustic transducer unit may be arranged at a position of the support arm 1030 close to the mass element 1040 or close to a connection between the support arms 1030 and the base structure 1010. Preferably, the effective acoustic transducer unit may be arranged at a position of the support arms 1030 close to the mass element 1040. In some embodiments, when the effective acoustic transducer unit is arranged at the position of the support arms 1030 close to the mass element 1040 or close to the connection between the support arms 1030 and the base structure 1010, a ratio of a cover area of the effective acoustic transducer unit on the support arms 1030 to an area of the support arms 1030 may be within a range of 5%-40%. Preferably, the ratio of the cover area of the effective acoustic transducer unit on the support arms 1030 to the area of the support arms 1030 may be within a range of 10%-35%. Further preferably, the ratio of the cover area of the effective acoustic transducer unit 1020 on the support arms 1030 to the area of the support arms 1030 may be within a range of 15%-20%.

The SNR of the bone conduction sound transmission device 1000 may be positively correlated with an intensity of an output electrical signal. When the laminated structure moves relative to the base structure, a deformation stress of the connection between the support arms 1030 and the mass element 1040 and a deformation stress of the connection between the support arms 1030 and the base structure 1010 may relatively larger than a deformation stress of the middle region of the support arms 1030. Further, an intensity of an output voltage of the connection between the support arms 1030 and the mass element 1040 and the intensity of the output voltage of the connection between the support arms 1030 and the base structure 1010 may be relatively larger than the intensity of the output voltage of the middle region of the support arms 1030. In some embodiments, when the acoustic transducer unit completely or nearly completely covers the upper surface or the lower surface of the support arms 1030, in order to improve the SNR of the bone conduction sound transmission device 1000, an electrode insulated trench 1050 may be arranged on the first electrode layer. The electrode insulated trench 1050 may divide the first electrode layer into two parts, so that one part of the first electrode layer may be close to the mass element 1040, and the other part of the first electrode layer may be close to the connection between the support arms 1030 and the base structure 1010. In some embodiments, the electrode insulated trench 1050 may be a straight line extending along a width direction of the support arms 1030. In some embodiments, a width of the electrode insulated trench 1050 may be within a range of 2 µm-20 µm. Preferably, the width of the electrode insulated trench 1050 may be within a range of 4 µm-10 µm.

It should be noted that the electrode insulated trench 1050 may not limited to the straight line extending along the width direction of the support arms 1030, but may also be a curve, a bent line, a wavy line, etc. In addition, the electrode insulated trench 1050 may not extend along the width direction of the support arms 1030, such as an electrode insulated trench 11200 in FIG. 12. The electrode insulated trench may divide the acoustic transducer unit into multiple parts, which is not further limited herein.

Figure 12:
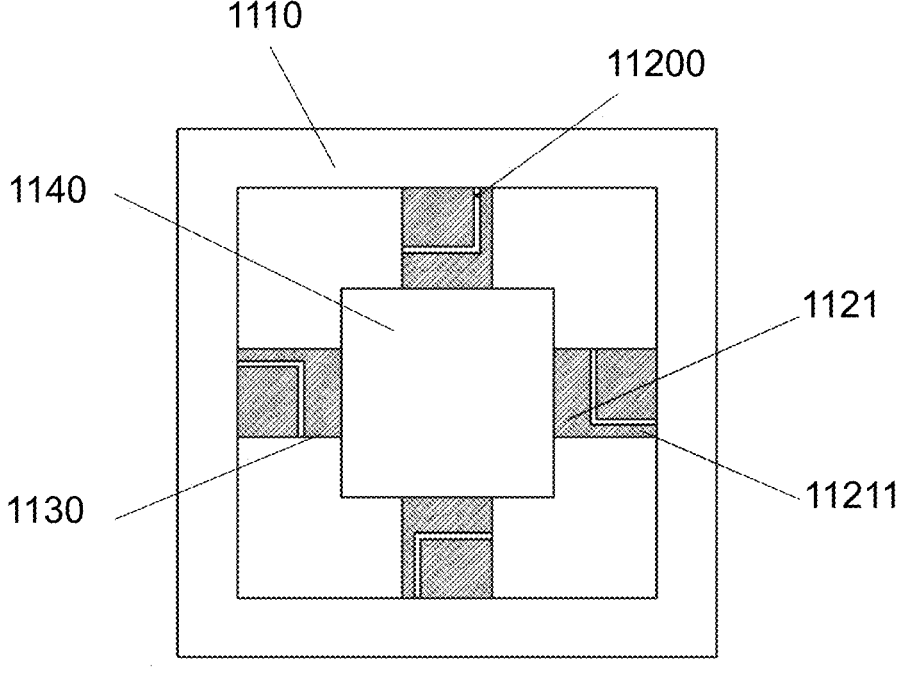
FIG. 12 is a schematic structural diagram illustrating a bone conduction sound transmission device according to some embodiments of the present disclosure.

As shown in FIG. 12, when a partial structure (e.g., the acoustic transducer unit between the electrode insulated trench 11200 and the mass element 1140 in FIG. 12) of the acoustic transducer unit is arranged at a position of the support arms 1130 close to the mass element 1140, the first electrode layer 1121 and/or the second electrode layer may also include an electrode lead. Taking the first electrode layer 1121 as an example, the electrode insulated trench 11200 may divide the first electrode layer 1121 into two parts. One part of the first electrode layer 1121 may be connected to the mass element 1140 or close to the mass element 1140, and the other part of the first electrode layer 1121 may be close to the connection between the support arms 1130 and the base structure 1110. In order to output the voltage of the acoustic transducer unit close to the mass element 1140, a part of region may be divided from the first electrode layer 1121 close to the connection between the support arms 1130 and the base structure 1110 (the first electrode layer 1121 located at the edge of the support arms 1130 in the figure). This part of the region may electrically connect the part of the acoustic transducer unit connected to the mass element 1140 or close to the mass element 1140 with a processing unit of the bone conduction sound transmission device. In some embodiments, a width of the electrode lead may be within a range of 4 µm-20 µm. Preferably, the width of the electrode lead may be within a range of 4 µm-10 µm. In some embodiments, the electrode lead may be located at any position of the support arms 1130 in the width direction. For example, the electrode lead may be located at the center of the support arms 1130 or a position of the support arms 1130 close to the edge in the width direction. Preferably, the electrode lead may be located at a position of the support arms 1130 close to the edge in the width direction. The use of a conductive wire in the acoustic transducer unit may be avoided by arranging the electrode lead, and the structure of the acoustic transducer unit is relatively simple, which is convenient for subsequent production and assembly.

Figure 13:
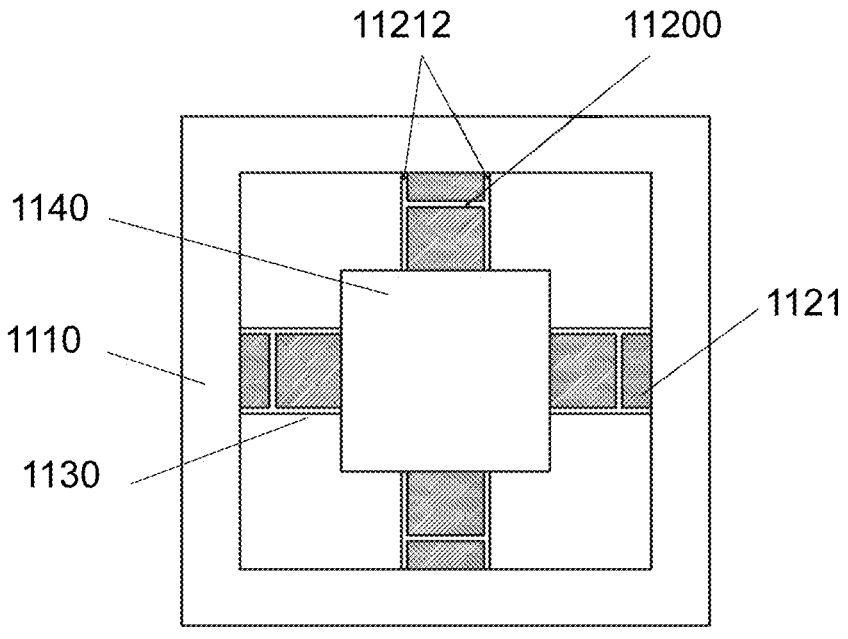
FIG. 13 is a schematic structural diagram illustrating a bone conduction sound transmission device according to some embodiments of the present disclosure.

As shown in FIG. 13, the piezoelectric material of the piezoelectric layer may be roughed in the region close to the edge of the support arms due to etching, so that the quality of the piezoelectric material may deteriorate. In some embodiments, when the area of the piezoelectric layer is the same as the area of the second electrode layer, in order to make the first electrode layer 1121 be located in the region of the piezoelectric layer with good piezoelectric material, the area of the piezoelectric layer may be less than the area of the first electrode layer 1121, so that the edge region of the first electrode layer 1121 may avoid the edge region of the piezoelectric layer, and an electrode retraction trench 11212 may be formed between the first electrode layer 1121 and the piezoelectric layer. The first electrode layer and the second electrode layer may avoid the region of the piezoelectric layer with poor edge quality by arranging the electrode retraction trench 11212, thereby improving the SNR of the output signal of the bone conduction sound transmission device. In some embodiments, a width of the electrode retraction trench 11212 may be within a range of 2 µm-20 µm. Preferably, the width of the electrode retraction trench 11212 may be within a range of 2 µm-10 µm.

Figure 14:
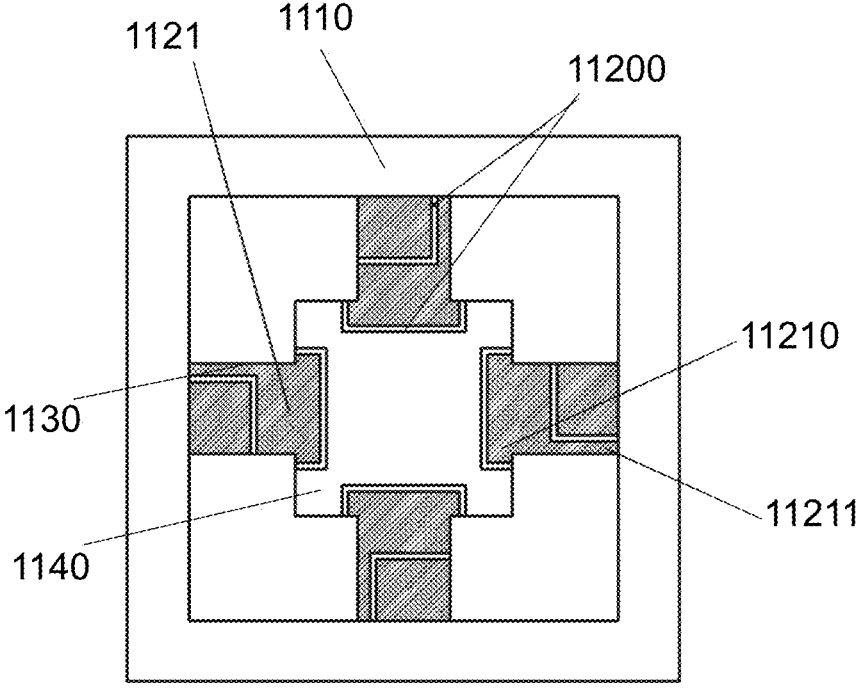
FIG. 14 is a schematic structural diagram illustrating a bone conduction sound transmission device according to some embodiments of the present disclosure.

As shown in FIG. 14, in some embodiments, taking the mass element 1140 protruding downward relative to the support arms 1130 as an example, the acoustic transducer unit may further include an extension region 11210 extending along a length direction of the support arms 1130. The extension region 11210 may be located on the upper surface of the mass element 1140. In some embodiments, an electrode insulated trench 11200 may be arranged at an edge position of the extension region 11210 located on the upper surface of the mass element 1140 to prevent excessive stress concentration of the support arms 1130, thereby improving the stability of the support arms 1130. In some embodiments, the length of the extension region 11210 may be greater than the width of the support arms 1130. Here, the length of the extension region 11210 may correspond to the width of the support arms 1130. In some embodiments, the length of the extension region 11210 may be within a range of 4 µm-30 µm. Preferably, the length of the extension region 11210 may be within a range of 4 µm-15 µm. In some embodiments, the length of the extension region 11210 on the mass element 1140 may be 1.2 times-2 times of the width of a connecting part between the support arms 1130 and the edge of the mass element 1140. Preferably, the length of the extension region 11210 on the mass element 1140 may be 1.2 times-1.5 times of the width of the connecting part between the support arms 1130 and the edge of the mass element 1140. For the parameters such as material and size of the acoustic transducer unit, the first electrode layer, the second electrode layer, the piezoelectric layer, the vibration unit, and the mass element 1140 in this embodiment, please refer to the contents of FIGS. 8-10, which is not repeated herein.

Figure 15:
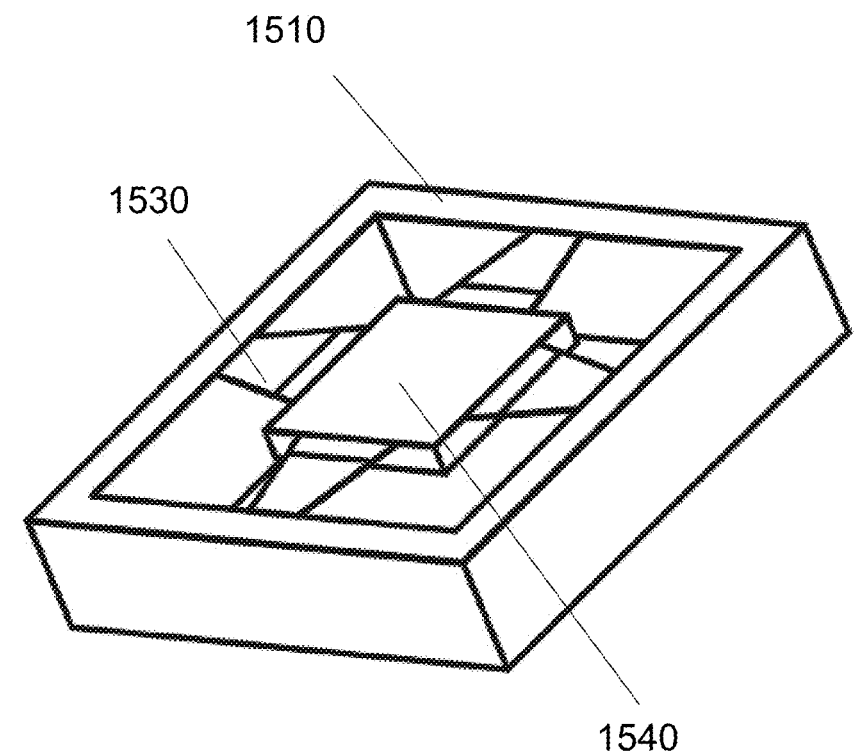
FIG. 15 is a schematic structural diagram illustrating a bone conduction sound transmission device according to some embodiments of the present disclosure.

FIG. 15 is a schematic structural diagram illustrating another bone conduction sound transmission device according to some embodiments of the present disclosure. The structure of the bone conduction sound transmission device 1500 in FIG. 15 may be substantially the same as that of the bone conduction sound transmission device 800 in FIG. 8. The difference may be that the connection method between the support arms and the base structure is different. As shown in FIG. 15, the base structure 1510 may be a cuboid frame structure. In some embodiments, the interior of the base structure 1510 may include a hollow part configured to suspend an acoustic transducer unit and a vibration unit. In some embodiments, the vibration unit may include four support arms 1530 and a mass element 1540. One end of each of the four support arms 1530 may be connected to an upper surface or a lower surface of the base structure 1510, or a side wall where the hollow part of the base structure 1510 is located, and the other end of each of the four support arms 1530 may be connected to the upper surface, the lower surface, or a circumferential side wall of the mass element 1540. In some embodiments, the mass element 1540 may protrude upward and/or downward relative to support arms 1530. For example, when the ends of the four support arms 1530 are connected to the upper surface of the mass element 1540, the mass element 1540 may protrude downward relative to the support arms 1530. As another example, when the ends of the four support arms 1530 are connected to the lower surface of the mass element 1540, the mass element 1540 may protrude upward relative to the support arms 1530. For another example, when the ends of the four support arms 1530 are connected to the circumferential side wall of the mass element 1540, the mass element 1540 may protrude upward and downward relative to the support arms 1530. In some embodiments, the shape of each of the support arms 1530 may be trapezoidal. The end of each of the support arms 1530 with a large width may be connected to the mass element 1540, and the end of each of the support arms 1530 with a small width may be connected to the base structure 1510. It should be noted that the structure, size, thickness, and other parameters of the acoustic transducer unit 820, the first electrode layer 821, the second electrode layer 823, the piezoelectric layer 822, the vibration unit, the mass element 840, the extension region 8210, the electrode insulated trench 8201, the electrode retraction trench, the electrode insulated trench 8200, and other components in FIGS. 8-10 may be applied to the bone conduction sound transmission device 1500, which is not further described herein.

Figure 16:
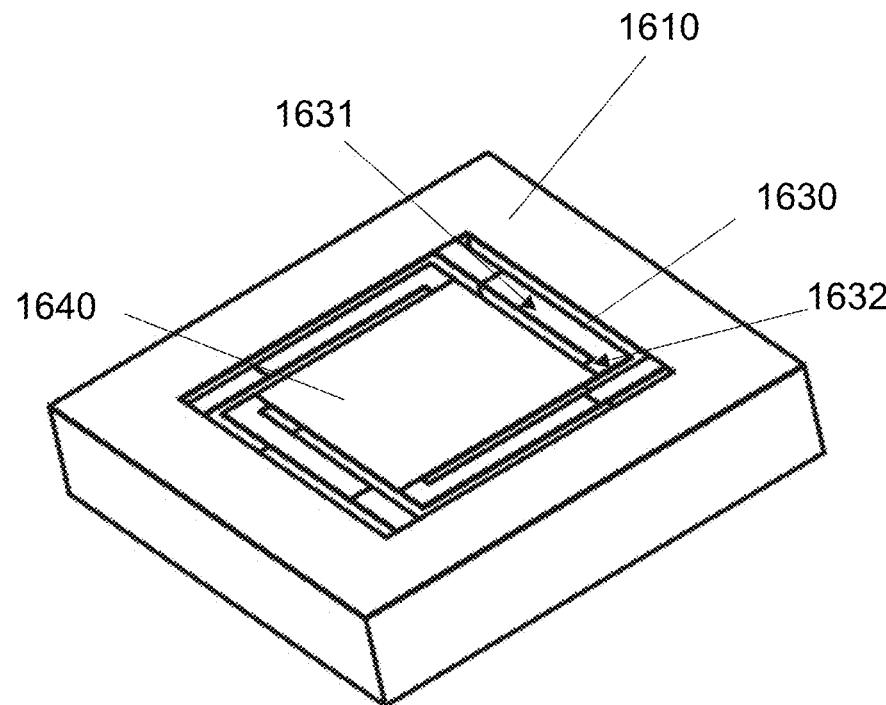
FIG. 16 is a schematic structural diagram illustrating a bone conduction sound transmission device according to some embodiments of the present disclosure.

FIG. 16 is a schematic structural diagram illustrating a bone conduction sound transmission device according to some embodiments of the present disclosure. The structure of the bone conduction sound transmission device 1600 in FIG. 16 may be substantially the same as that of the bone conduction sound transmission device 800 in FIG. 8. The difference is that the structure of each of the support arms 1630 of the bone conduction sound transmission device 1600 may be different from that of each of the support arms 830 of the bone conduction sound transmission device 800. In some embodiments, the interior of a base structure 1610 may include a hollow part configured to suspend an acoustic transducer unit and a vibration unit. In some embodiments, the vibration unit may include four support arms 1630 and a mass element 1640. One end of each of the four support arms 1630 may be connected to an upper surface or a lower surface of the base structure 1610, or a side wall where the hollow part of the base structure 1610 is located, and the other end of each of the support arms 1630 may be connected to the upper surface, the lower surface, or a circumferential side wall of the mass element 1640. In some embodiments, the mass element 1640 may protrude upward and/or downward relative to the support arms 1630. For example, when the ends of the four support arms 1630 are connected to the upper surface of the mass element 1640, the mass element 1640 may protrude downward relative to the support arms 1630. As another example, when the ends of the four support arms 1630 are connected to the lower surface of the mass element 1640, the mass element 1640 may protrude upward relative to the support arms 1630. As another example, when the ends of the four support arms 1630 are connected to the circumferential side wall of the mass element 1640, the mass element 840 may protrude upward and downward relative to the support arms 1630. In some embodiments, the upper surface of the mass element 1640 and the upper surface of the support arms 1630 may be on the same horizontal plane, and/or the lower surface of the mass element 1640 and the lower surface of the support arms 1630 may be on the same horizontal plane. In some embodiments, the shape of each of the support arms 1630 may be an approximately L-shaped structure. As shown in FIG. 16, the support arms 1630 may include a first support arm 1631 and a second support arm 1632. One end part of the first support arm 1631 may be connected to one end part of the second support arm 1632. A certain included angle may be formed between the first support arm 1631 and the second support arm 1632. In some embodiments, the included angle may be within a range of 75°-105°. In some embodiments, one end of the first support arm 1631 away from a connection between the first support arm 1631 and the second support arm 1632 may be connected to the base structure 1610, and one end of the second support arm 1632 away from the connection between the first support arm 1631 and the second support arm 1632 may be connected to the upper surface, the lower surface, or the circumferential side wall of the mass element 1640, so that the mass element 1640 may be suspended in the hollow part of the base structure 1610.

In some embodiments, the acoustic transducer unit may be a multi-layer structure. The acoustic transducer unit may include a first electrode layer, a second electrode layer, a piezoelectric layer, an elastic layer, a seed layer, an electrode insulated trench, an electrode retraction trench, or other structures. For the structure of each layer of the acoustic transducer unit, the mass element 1640, etc., please refer to the descriptions about the acoustic transducer unit 820, the first electrode layer 821, the second electrode layer 823, the piezoelectric layer 822, the vibration unit, the mass element 840, the extension region 8210, the electrode insulated trench 8201, the electrode retraction trench, and the electrode insulated trench 8200 in FIGS. 8-10 of the present disclosure, which is not further described herein.

In some embodiments, the bone conduction sound transmission device described in any one of the above embodiments may further include a limiting structure (not shown in the figure). The limiting structure may be a plate-shaped structure. In some embodiments, the limiting structure may be located in the hollow part of the base structure. The limiting structure may be located above or below the laminated structure and arranged opposite to the laminated structure. In some embodiments, when the base structure is a vertically penetrating structure, the limiting structure may also be located at the top or bottom of the base structure. The limiting structure and the mass element of the laminated structure may be arranged at intervals. The limiting structure may limit an amplitude of the mass element in the laminated structure when the laminated structure is subjected to a large impact, so as to avoid damage to the device due to severe vibration. In some embodiments, the limiting structure may also be a rigid structure (e.g., a limiting block), or a structure with a certain elasticity (e.g., an elastic cushion, a buffer cantilever beam, or both a buffer support arm and the limiting block).

Figure 17:
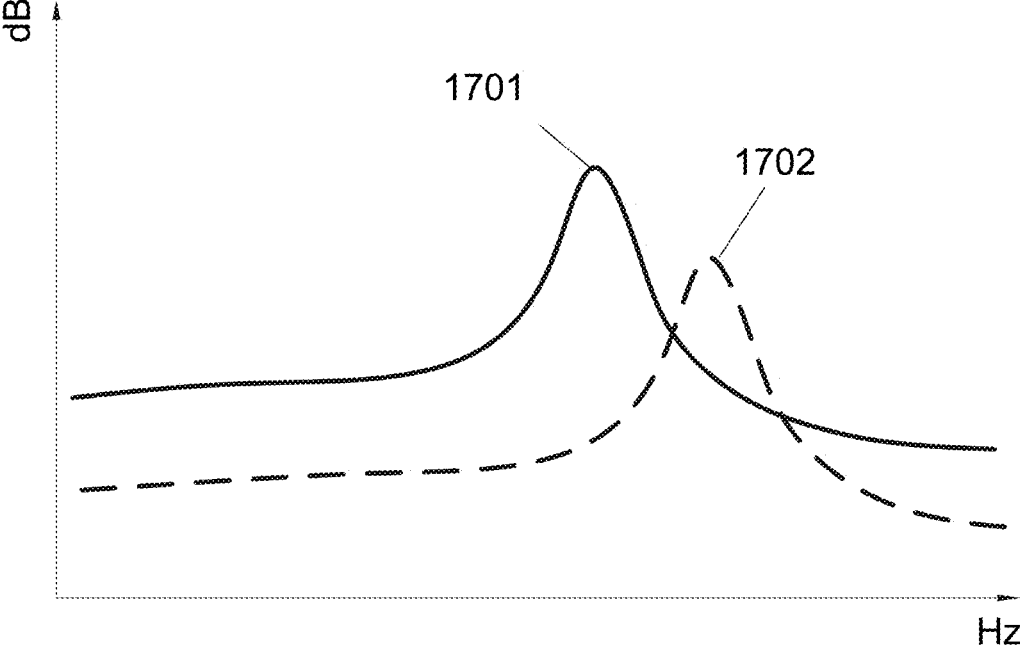
FIG. 17 is a frequency response curve illustrating a natural frequency advance of a laminated structure according to some embodiments of the present disclosure.

The laminated structure has a natural frequency. When a frequency of an external vibration signal is close to the natural frequency, the laminated structure may generate a larger amplitude, thereby outputting a larger electrical signal. Therefore, the response of the bone conduction sound transmission device to the external vibration may present as generating a form ant near the natural frequency. In some embodiments, by changing the parameters of the laminated structure, the natural frequency of the laminated structure may be shifted to a voice frequency band range, so that the formant of the bone conduction sound transmission device may be within the voice frequency band range, thereby improving the sensitivity of the bone conduction sound transmission device in response to the vibration in the voice frequency band (e.g., the frequency range before the formant). As shown in FIG. 17, a frequency of a formant 1701 in a frequency response curve (solid curve in FIG. 17) of the natural frequency advance of the laminated structure may be relatively smaller than a frequency of a form ant 1702 in a frequency response curve (dotted curve in FIG. 17) of the unchanged natural frequency of the laminated structure. For an external vibration signal whose frequency is less than the frequency of the form ant 1701, the bone conduction sound transmission device corresponding to the solid curve may have a higher sensitivity.

The displacement output formula of the laminated structure is as follows:

$$x_a = \frac{F}{\omega|Z|} = \frac{F}{\omega\sqrt{R^2 + \left(\omega M - K\omega^{-1}\right)^2}}, \tag{1}$$

where M denotes a mass of the laminated structure, R denotes a damping of the laminated structure, K denotes an elastic coefficient of the laminated structure, F denotes an amplitude of the driving force, $x_a$ denotes a displacement of the laminated structure, co denotes a circular frequency of the external force, and $\omega_0$ denotes the natural frequency of the laminated structure. When the circular frequency of the external force $$\omega < \omega_0\left(\omega_0 = \frac{F}{M}\right),$$

then $\omega M < K\omega^{-1}$. If the natural frequency $\omega_0$ of the laminated structure is reduced (by increasing M or decreasing K, or both increasing M and decreasing K), then $|\omega M < K\omega^{-1}|$ decreases, and the corresponding output displacement $x_a$ increases. When the frequency of the exciting force $\omega = \omega_0$, then $\omega M = K\omega^{-1}$. When the natural frequency $\omega_0$ of the vibration-electrical signal conversion device (laminated structure) is changed, the corresponding output displacement $x_a$ remains unchanged. When the frequency of the exciting force $\omega > \omega_0$, then $\omega M > K\omega^{-1}$. If the natural frequency $\omega_0$ of the vibration-electric signal conversion device is reduced (by increasing M or decreasing K, or both increasing M and decreasing K), then $|\omega M - K\omega^{-1}|$ increases, and the corresponding output displacement $|\omega M - K\omega^{-1}|$ decreases.

With the advance of the formant, the peak may appear in the voice frequency band. When the bone conduction sound transmission device collects the signal, there may be too much signal in the formant frequency band, which makes a poor communication effect. In some embodiments, in order to improve the quality of the sound signal collected by the bone conduction sound transmission device, a damping structure layer may be arranged at the laminated structure. The damping structure layer may increase an energy loss of the laminated structure during the vibration process, especially the loss at a resonance frequency band. Here, the reciprocal 1/Q of the mechanical quality factor is used to describe the damping coefficient as follows:

$$Q^{-1} = \frac{\Delta f}{\sqrt{3} f_0}, \tag{2}$$

where $$Q^{-1} = \frac{\Delta f}{\sqrt{3} f_0}$$

denotes the reciprocal of the quality factor, which is also referred to as the structural loss factor η, Δf denotes the frequency difference f1−f2 (also referred to as the 3 dB bandwidth) at half the resonance amplitude, and f0 denotes the resonance frequency.

The relationship between the loss factor η of the laminated structure and the loss factor tan δ of the damping material may be as follows:

$$\eta = \frac{XY\tan\delta}{1 + (2 + Y)X + (1 + Y)\left[1 + (\tan\delta)^2\right]X^2}, \tag{3}$$

where X denotes a shear parameter, which is related to the thickness and material properties of each layer of the laminated structure. Y denotes a stiffness parameter, which is related to the thickness and Young's modulus of each layer of the laminated structure.

Figure 18:
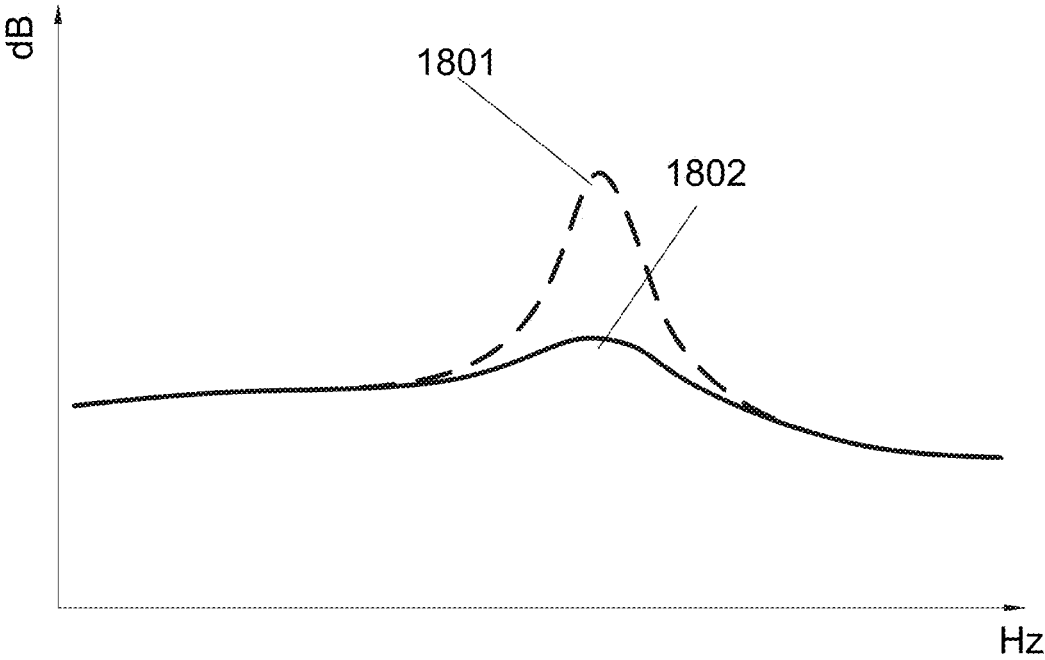
FIG. 18 is a frequency response curve illustrating a bone conduction sound transmission device with or without a damping structure layer according to some embodiments of the present disclosure.

According to formula (2) and formula (3), it can be seen that by adjusting the material of the damping structure layer and the material of each layer of the laminated structure, the loss factor η of the laminated structure may be adjusted in a suitable range. As the damping of the damping structure layer of the laminated structure increases, the mechanical quality factor Q decreases, and the corresponding 3 dB bandwidth increases. The damping of the damping structural layer may be different under different stress (deformation) states. For example, damping may be greater at high stress or large amplitude. Therefore, the characteristics of the laminated structure with small amplitude in the non-resonance region and large amplitude in the resonance region may be used, by adding the damping structure layer, the Q value in the resonance region may be reduced while ensuring that the sensitivity of the bone conduction microphone in the non-resonance region is not reduced, so that the frequency response of the bone conduction sound transmission device is relatively flat over the entire frequency range. FIG. 18 is a frequency response curve illustrating a bone conduction sound transmission device with or without a damping structure layer according to some embodiments of the present disclosure. As shown in FIG. 18, a frequency response curve 1802 of an electrical signal outputted by the bone conduction sound transmission device with a damping structure layer may be relatively flat compared to the frequency response curve 1801 of the electrical signal outputted by the bone conduction sound transmission device without the damping structure layer.

In some embodiments, the bone conduction sound transmission device may include at least one damping structure layer. A circumferential side of the at least one damping structure layer may be connected to the base structure. In some embodiments, the at least one damping structure layer may be located on the upper surface and/or the lower surface of the laminated structure or between the multi-layer structure of the laminated structure. In some embodiments, for the macro-sized laminated structure and the base structure, the damping structure layer may be directly bonded to the surface of the base structure or the laminated structure. In some embodiments, for Micro-Electro-Mechanical System (MEMS) devices, the damping structure layer may be connected to the laminated structure and the base structure by using semiconductor processes, such as evaporation, spin coating, micro-assembly, etc. In some embodiments, the shape of the damping structure layer may be a regular shape such as a circle, an ellipse, a triangle, a quadrangle, a hexagon, an octagon, etc. In some embodiments, the output effect of the electrical signal of the bone conduction sound transmission device may be improved by selecting the material, dimension, thickness, etc. of the damping membrane.

Figure 19:
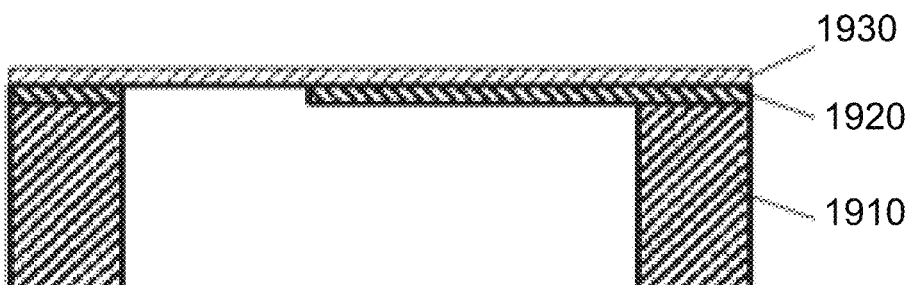
FIG. 19 is a sectional view of a bone conduction sound transmission device according to some embodiments of the present disclosure.

In order to describe the damping structure layer more clearly, the bone conduction sound transmission device in the form of a cantilever beam (e.g., the bone conduction sound transmission device 100 in FIG. 1, the bone conduction sound transmission device 300 in FIG. 3, the bone conduction sound transmission device 400 in FIG. 4) may be used as an exemplary illustration. FIG. 19 is a sectional view of a bone conduction sound transmission device according to some embodiments of the present disclosure. As shown in FIG. 19, the bone conduction sound transmission device 1900 may include a base structure 1910, a laminated structure 1920, and a damping structure layer 1930. Further, one end of the laminated structure 1920 may be connected to an upper surface of the base structure 1910, and the other end of the laminated structure 1920 may be suspended in a hollow part of the base structure 1910. The damping structure layer 1930 may be located on an upper surface of the laminated structure 1920. An area of the damping structure layer 1930 may be greater than an area of the laminated structure 1920, i.e., the damping structure layer 1930 may not only cover the upper surface of the laminated structure 1920, but may also cover a gap between the laminated structure 1920 and the base structure 1910. In some embodiments, at least part of a circumferential side of the damping structure layer 1930 may be fixed on the base structure 1910.

Figure 20:
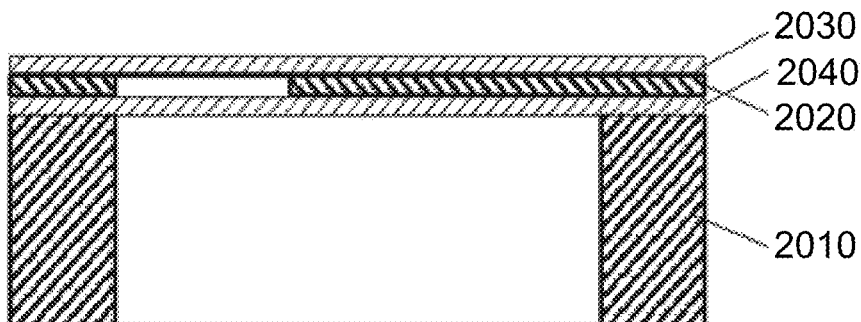
FIG. 20 is a sectional view of a bone conduction sound transmission device according to some embodiments of the present disclosure.

FIG. 20 is a sectional view of a bone conduction sound transmission device according to some embodiments of the present disclosure. As shown in FIG. 20, the bone conduction sound transmission device 2000 may include a base structure 2010, a laminated structure 2020, and two damping structure layers. The two damping structure layers may include a first damping structure layer 2030 and a second damping structure layer 2040. Further, the second damping structure layer 2040 may be connected to an upper surface of the base structure 2010. A lower surface of the laminated structure 2020 may be connected to the upper surface of the second damping structure layer 2030. One end of the laminated structure 2020 may be suspended in a hollow part of the base structure 2010. The first damping structure layer 2030 may be located on the upper surface of the laminated structure 2020. An area of the first damping structure layer 2030 and/or the second damping structure layer 2040 may be greater than an area of the laminated structure 2020.

Figure 21:
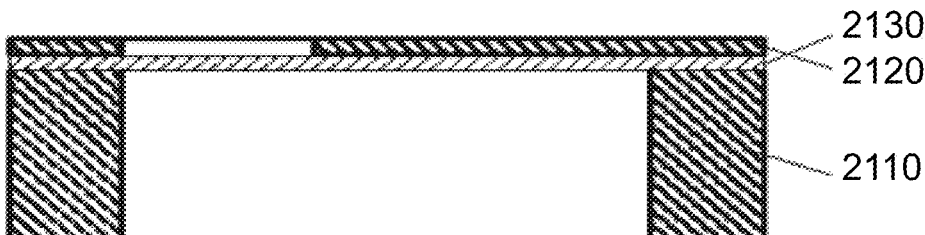
FIG. 21 is a sectional view of a bone conduction sound transmission device according to some embodiments of the present disclosure.

FIG. 21 is a sectional view of a bone conduction sound transmission device according to some embodiments of the present disclosure. As shown in FIG. 21, the bone conduction sound transmission device 2100 may include a base structure 2110, a laminated structure 2120, and a damping structure layer 2130. Further, the damping structure layer 2130 may be located on a lower surface of the base structure 2110. The lower surface of the laminated structure 2120 may be connected to an upper surface of the damping structure layer 2130. One end of the laminated structure 2120 may be suspended in a hollow part of the base structure 2110.

It should be noted that the damping structure layer (e.g., the damping structure layer 1930) may not be limited to be located on the upper surface and/or the lower surface of the above-mentioned laminated structure in FIGS. 19-21, and may also be located between the multi-layer structure of the laminated structure. For example, the damping structure layer may be located between an elastic layer and a first electrode layer. As another example, the damping structure layer may also be located between a first elastic layer and a second elastic layer. In addition, the damping structure layer may not be limited to be applied in the above-mentioned bone conduction sound transmission device in the form of a cantilever beam, and may also be applied to the bone conduction sound transmission device in FIGS. 5, 7, 8, 11, 15, and 16, which is not repeated herein.

The basic concept has been described above. Obviously, for those skilled in the art, the above detailed disclosure is only an example, and does not constitute a limitation to the present disclosure. Although not explicitly stated here, those skilled in the art may make various modifications, improvements, and amendments to the present disclosure. Such modifications, improvements, and amendments are intended to be suggested in this disclosure, so such modifications, improvements, and amendments still belong to the spirit and scope of the exemplary embodiments of this disclosure.

Moreover, certain terminology has been used to describe embodiments of the present disclosure. For example, "one embodiment", "an embodiment", and/or "some embodiments" refer to a certain feature, structure, or characteristic related to at least one embodiment of the present disclosure. Therefore, it should be emphasized and noted that two or more references to "an embodiment" "one embodiment" or "an alternative embodiment" in various places in this disclosure are not necessarily referring to the same embodiment. In addition, certain features, structures, or characteristics of one or more embodiments of the present disclosure may be properly combined.

In addition, those skilled in the art may understand that various aspects of the present disclosure may be illustrated and described through several patentable categories or situations, including any new and useful processes, machines, products, or combinations of materials, or any new and useful improvements. Accordingly, all aspects of the present disclosure may be performed entirely by hardware, may be performed entirely by software (including firmware, resident software, microcode, etc.), or may be performed by a combination of hardware and software. The above hardware or software may be referred to as "data block", "module", "engine", "unit", "component" or "system". Additionally, aspects of the present disclosure may be embodied as a computer product located in one or more computer-readable media, the product including computer-readable program code.

Furthermore, unless explicitly stated in the claims, the order of processing elements and sequences described in the present disclosure, the use of numbers and letters, or the use of other names are not intended to limit the order of the procedures and methods of the present disclosure. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, while the system components described above may be implemented as hardware devices, they may also be implemented as a software-only solution, such as installing the described system on an existing processing device or mobile device.

Similarly, it should be appreciated that in the foregoing description of embodiments of the present disclosure, various features are sometimes grouped together in a single embodiment, figure, or description thereof for the purpose of streamlining the disclosure and aiding in the understanding of one or more of the various embodiments. However, this disclosure does not mean that the present disclosure object requires more features than the features mentioned in the claims. Rather, claimed subject matter may lie in less than all features of a single foregoing disclosed embodiment.

In some embodiments, numbers describing the quantity of components and attributes are used. It should be understood that such numbers used in the description of the embodiments use the modifiers "about", "approximately" or "substantially" in some examples. Unless stated otherwise, "about", "approximately" or "substantially" means that a variation of ±20% is allowed for the stated number. Accordingly, in some embodiments, the numerical parameters set forth in the specification and claims are approximations that may vary depending upon the desired characteristics of individual embodiments. In some embodiments, numerical parameters should consider the specified significant digits and adopt the general digit retention method. Notwithstanding that the numerical fields and parameters used in some embodiments of the present disclosure to confirm the breadth of their ranges are approximations, in specific embodiments, such numerical values are set as precisely as practicable.

The entire contents of each patent, patent disclosure, patent disclosure publication, and other material, such as an article, a book, a specification, a publication, document, etc., cited in this disclosure are hereby incorporated into this disclosure by reference. Application history documents that are inconsistent with or conflict with the content of this disclosure are excluded, as are documents (currently or hereafter appended to this disclosure) that limit the broadest scope of the claims of this disclosure. It should be noted that if there is any inconsistency or conflict between the descriptions, definitions, and/or terms used in the attached materials of this disclosure and the contents of this disclosure, the descriptions, definitions, and/or terms used in this disclosure shall prevail.

At last, it should be understood that the embodiments described in the present disclosure are merely illustrative of the principles of the embodiments of the present disclosure.

Other modifications that may be employed may be within the scope of the present disclosure. Thus, by way of example, but not of limitation, alternative configurations of the embodiments of the present disclosure may be utilized in accordance with the teachings herein. Accordingly, the embodiments of the present disclosure are not limited to the embodiments explicitly introduced and described in the present disclosure.

What is claimed is:

1. A bone conduction sound transmission device, comprising:
    a laminated structure formed by a vibration unit and an acoustic transducer unit; and
    a base structure configured to load the laminated structure, at least one side of the laminated structure being physically connected to the base structure; wherein
    the base structure vibrates based on an external vibration signal, and the vibration unit deforms in response to the vibration of the base structure; and the acoustic transducer unit generates an electrical signal based on the deformation of the vibration unit, wherein the vibration unit includes a suspension membrane structure, and the acoustic transducer unit includes a first electrode layer, a piezoelectric layer, and a second electrode layer arranged in sequence from top to bottom, the suspension membrane structure is connected to the base structure through a peripheral side of the suspension membrane structure, and the acoustic transducer unit is located on an upper surface or a lower surface of the suspension membrane structure.

2. The bone conduction sound transmission device of claim 1, wherein the suspension membrane structure includes a plurality of holes, and the plurality of holes are distributed along a circumferential direction of the acoustic transducer unit.

3. The bone conduction sound transmission device of claim 1, wherein the acoustic transducer unit is a ring structure, a thickness of the membrane structure located in an inner region of the ring structure is greater than a thickness of the membrane structure located in an outer region of the ring structure, or a density of the suspension membrane structure located in an inner region of the ring structure is greater than a density of the membrane structure located in an outer region of the ring structure.

4. The bone conduction sound transmission device of claim 1, wherein the vibration unit further includes a mass element, and the mass element is located on the upper surface or the lower surface of the suspension membrane structure.

5. The bone conduction sound transmission device of claim 1, further comprising at least one damping layer, wherein the at least one damping layer covers the upper surface, the lower surface, or interior of the laminated structure.

6. A bone conduction sound transmission device, comprising:
    a laminated structure formed by a vibration unit and an acoustic transducer unit; and
    a base structure configured to load the laminated structure, at least one side of the laminated structure being physically connected to the base structure; wherein
    the base structure vibrates based on an external vibration signal, and the vibration unit deforms in response to the vibration of the base structure; and the acoustic transducer unit generates an electrical signal based on the deformation of the vibration unit, wherein the vibration unit includes at least one support arm and a mass element, and the mass element is connected to the base structure through the at least one support arm, wherein the acoustic transducer unit is located on an upper surface, a lower surface, or interior of the at least one support arm.

7. The bone conduction sound transmission device of claim 6, wherein the acoustic transducer unit includes a first electrode layer, a piezoelectric layer, and a second electrode layer arranged in sequence from top to bottom, and the first electrode layer or the second electrode layer is connected to the upper surface or the lower surface of the at least one support arm.

8. The bone conduction sound transmission device of claim 7, wherein the mass element is located on an upper surface or a lower surface of the first electrode layer or an upper surface or a lower surface of the second electrode layer.

9. The bone conduction sound transmission device of claim 8, wherein an area of the first electrode layer, the piezoelectric layer, or the second electrode layer is less than or equal to an area of the at least one support arm, and a part or all of the first electrode layer, the piezoelectric layer, or the second electrode layer covers the upper surface or the lower surface of the at least one support arm.

10. The bone conduction sound transmission device of claim 9, wherein the first electrode layer, the piezoelectric layer, and the second electrode layer of the acoustic transducer unit are close to the mass element or a connection between the support arm and the base structure.

11. The bone conduction sound transmission device of claim 10, wherein the at least one support arm includes at least one elastic layer, and the at least one elastic layer is located on the upper surface or the lower surface of the first electrode layer or the upper surface or the lower surface of the second electrode layer.

12. The bone conduction sound transmission device of claim 6, further comprising a limiting structure located in a hollow part of the base structure, wherein the limiting structure is connected to the base structure, and the limiting structure is located above or below the mass element.

* * * * *